(12) United States Patent
Lim et al.

(10) Patent No.: US 10,860,127 B2
(45) Date of Patent: Dec. 8, 2020

(54) DISPLAY DEVICE

(71) Applicant: Samsung Display Co., Ltd., Yongin-si (KR)

(72) Inventors: Jae Ik Lim, Yongin-si (KR); Jin Woo Choi, Yongin-si (KR); Won Sang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/200,563

(22) Filed: Nov. 26, 2018

(65) Prior Publication Data

US 2019/0179463 A1    Jun. 13, 2019

(30) Foreign Application Priority Data

Dec. 13, 2017  (KR) .................. 10-2017-0171620

(51) Int. Cl.
| | | |
|---|---|---|
| *G06F 3/041* | (2006.01) | |
| *G06F 3/044* | (2006.01) | |
| *G06K 9/00* | (2006.01) | |
| *G06F 1/16* | (2006.01) | |
| *H01L 27/12* | (2006.01) | |

(52) U.S. Cl.
CPC .......... *G06F 3/0412* (2013.01); *G06F 1/1626* (2013.01); *G06F 1/1641* (2013.01); *G06F 1/1643* (2013.01); *G06F 3/044* (2013.01); *G06F 3/0416* (2013.01); *G06F 3/0443* (2019.05); *G06F 3/0446* (2019.05); *G06F 3/04164* (2019.05); *G06K 9/0002* (2013.01); *G06F 1/1692* (2013.01); *G06F 2203/04111* (2013.01); *H01L 27/1255* (2013.01)

(58) Field of Classification Search
CPC .... G06F 3/0412; G06F 1/1641; G06F 3/0416; G06F 3/0443; G06F 1/1643; G06F 1/1626; G06F 3/0446; G06F 3/04164; G06F 3/044; G06F 2203/04111; G06F 1/1692; G06K 9/0002; H01L 27/1255
See application file for complete search history.

(56) References Cited

U.S. PATENT DOCUMENTS

| | | | | |
|---|---|---|---|---|
| 2011/0304566 A1* | 12/2011 | Han | ......................... | G06F 3/044 345/173 |
| 2013/0002133 A1* | 1/2013 | Jin | ......................... | H01L 51/524 313/511 |
| 2014/0253477 A1* | 9/2014 | Shim | ...................... | G06F 3/0487 345/173 |
| 2014/0354596 A1* | 12/2014 | Djordjev | .............. | G06K 9/0002 345/175 |

(Continued)

FOREIGN PATENT DOCUMENTS

KR          10-1769740 B1      8/2017

*Primary Examiner* — Premal R Patel
(74) *Attorney, Agent, or Firm* — Lewis Roca Rothgerber Christie LLP

(57) ABSTRACT

A display device has a display surface located at a front surface and an auxiliary sensing surface located at a side surface. The display device includes a display panel including a display area and a non-display area. An input sensing unit is on the display panel and an auxiliary sensing unit is on the auxiliary sensing surface. The auxiliary sensing unit is configured to sense a fingerprint or palm print of a user and is formed in the same layer as any one of the display panel and the input sensing unit.

10 Claims, 20 Drawing Sheets

(56) References Cited

U.S. PATENT DOCUMENTS

| | | | |
|---|---|---|---|
| 2015/0261361 A1* | 9/2015 | Lee | G09G 3/3677 345/174 |
| 2015/0261376 A1* | 9/2015 | Kim | G06F 3/0487 345/173 |
| 2016/0170523 A1* | 6/2016 | Park | G06F 3/044 345/174 |
| 2016/0307973 A1* | 10/2016 | Yang | G06F 1/1643 |
| 2017/0031514 A1* | 2/2017 | Kimura | G06F 3/044 |
| 2017/0357440 A1* | 12/2017 | Tse | G06F 3/016 |

* cited by examiner

FIG. 1B
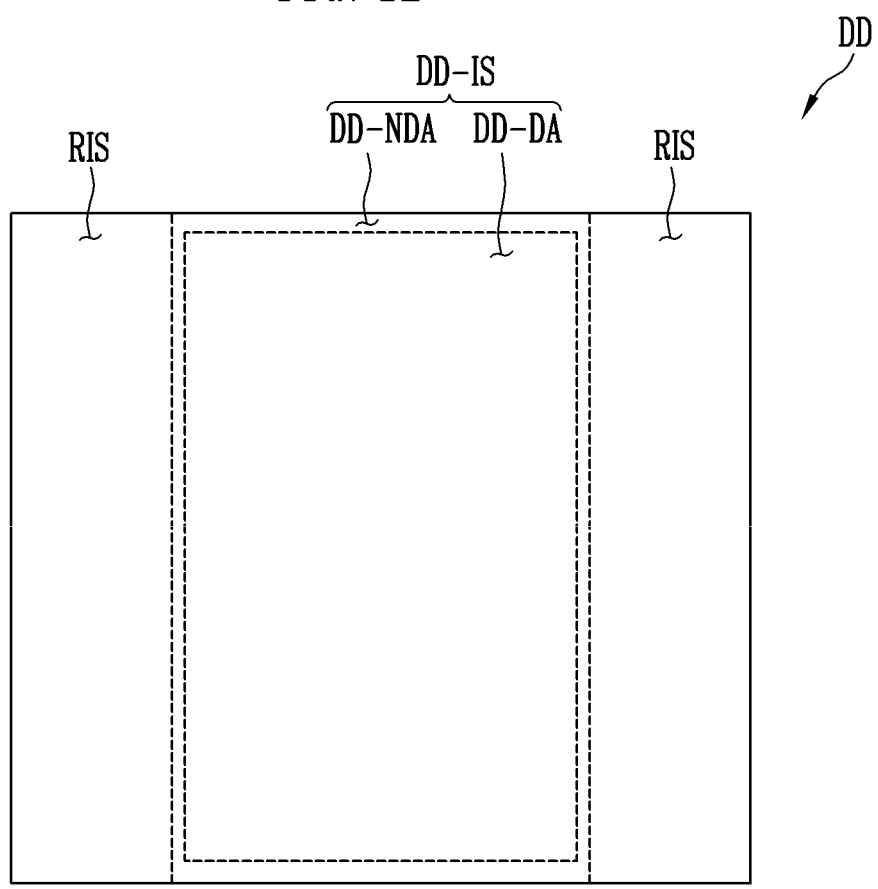
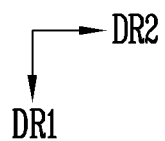

FIG. 1C
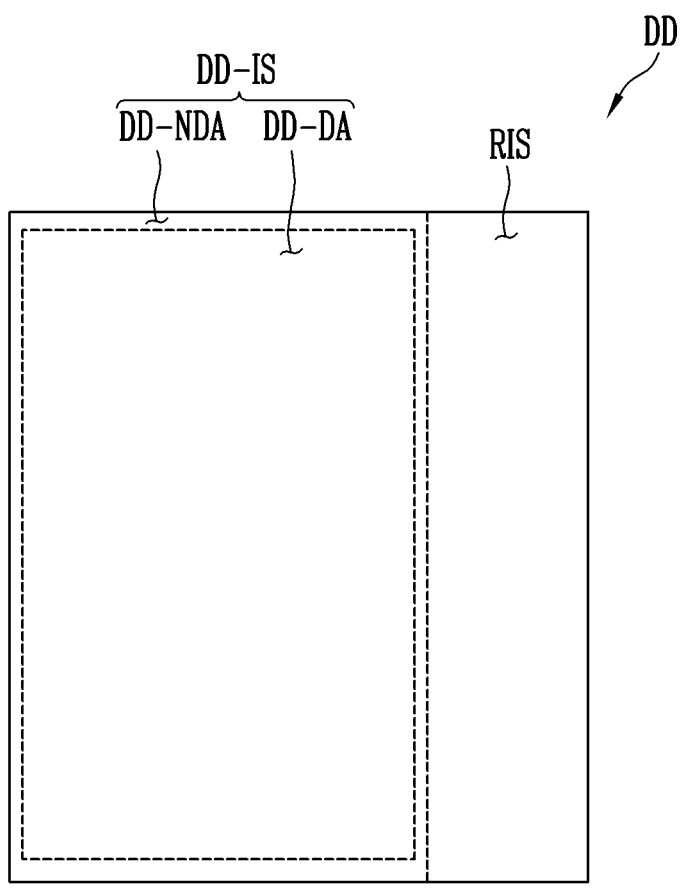
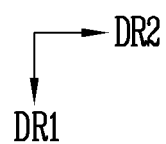

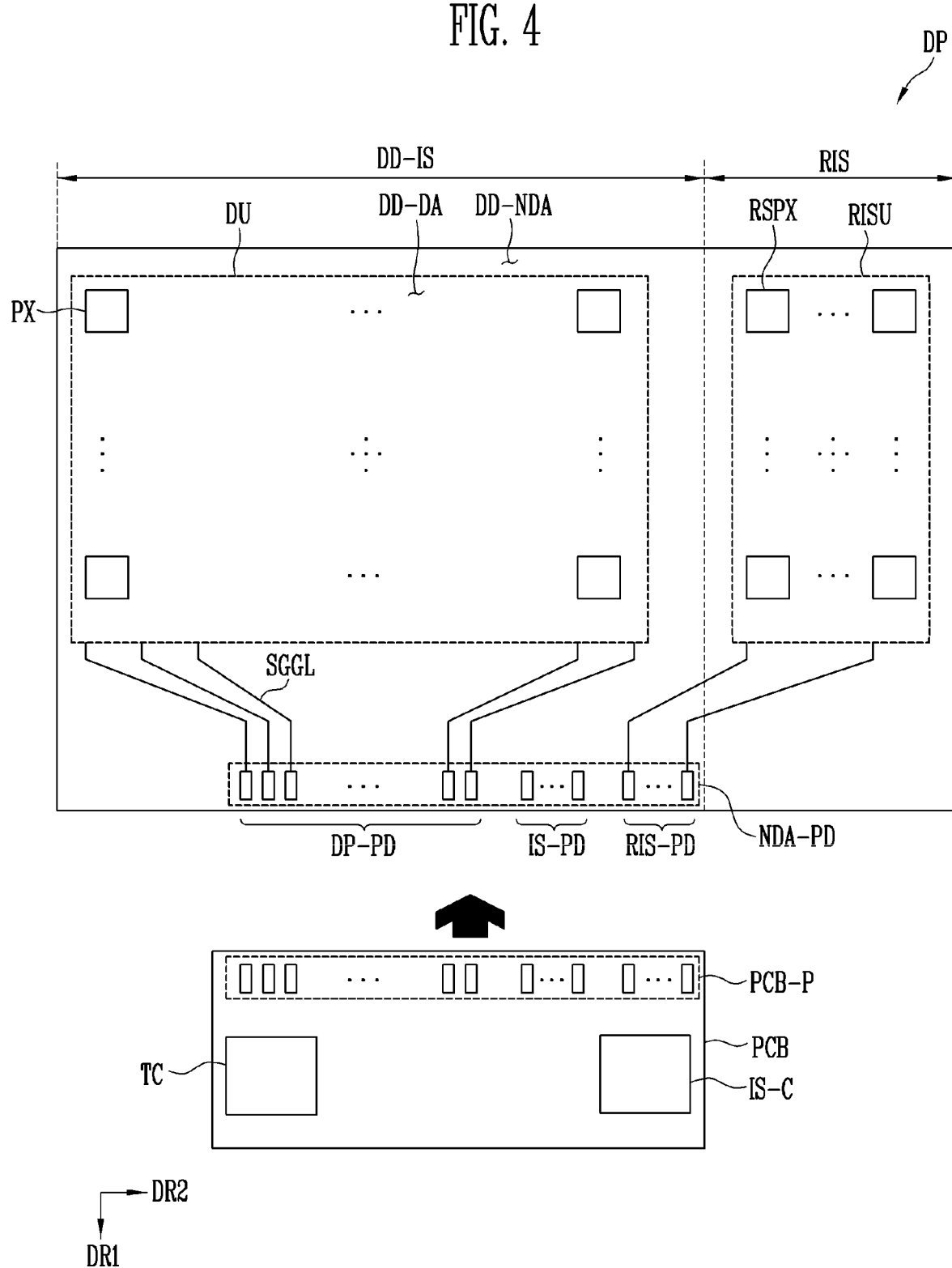

FIG. 11C
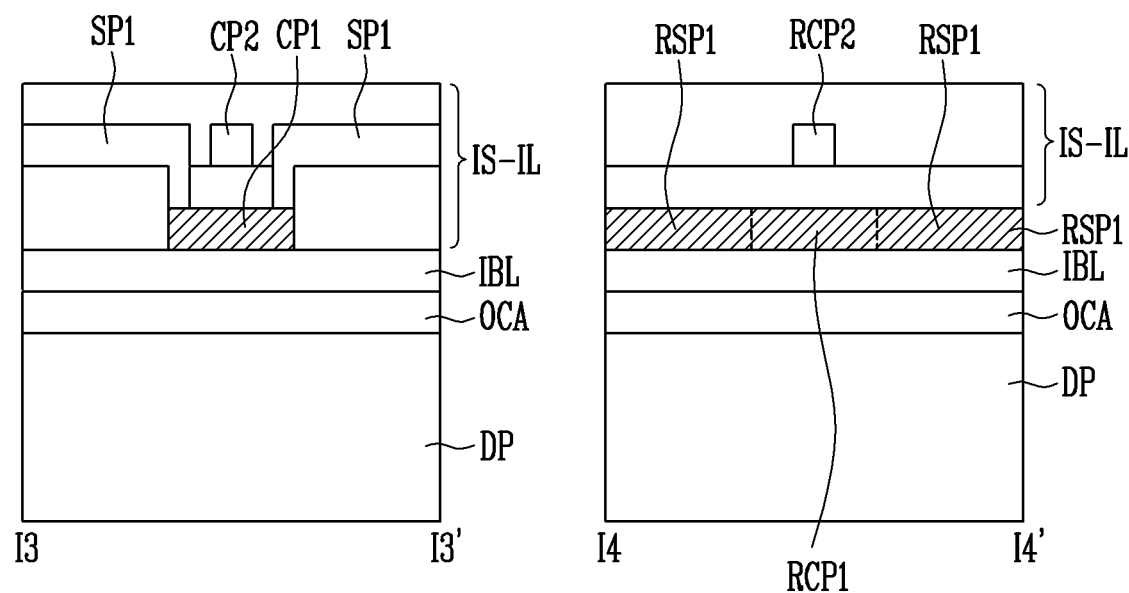

DISPLAY DEVICE

CROSS-REFERENCE TO RELATED APPLICATION

This application claims priority to and the benefit of Korean patent application 10-2017-0171620 filed on Dec. 13, 2017 in the Korean Intellectual Property Office, the entire disclosure of which is incorporated herein by reference.

BACKGROUND

1. Field

An aspect of the present disclosure relates to a display device.

2. Related Art

With the development of information technologies, the importance of a display device as a connection medium between a user and information increases. Accordingly, display devices such as liquid crystal display devices and organic light emitting display devices are increasingly used.

Recently, touch sensors for sensing touches or fingerprint sensors for sensing fingerprints have been provided in display devices.

SUMMARY

Embodiments provide a display device including an input sensing unit at a front surface of the display device and an auxiliary sensing unit at a side surface of the display device.

According to an aspect of the present disclosure, there is provided a display device having a display surface located at a front surface and an auxiliary sensing surface located at a side surface. The display device includes a display panel having a display area and a non-display area. An input sensing unit is disposed on the display panel and an auxiliary sensing unit is disposed at the auxiliary sensing surface. The auxiliary sensing unit is configured to sense at least one of a fingerprint or a palm print of a user. The auxiliary sensing unit is formed in the same layer as any one of the display panel and the input sensing unit.

According to an aspect of the present disclosure, the display panel may include a display unit having display pixels at the display surface and the auxiliary sensing unit having auxiliary pixels at the auxiliary sensing surface. The auxiliary sensing unit may be formed in the same layer as the display panel.

According to an aspect of the present disclosure, the display panel may include a base layer, a circuit element layer on the base layer, a display element layer on the circuit element layer, an auxiliary sensing element layer on the circuit element layer and spaced apart from the display element layer, and a thin film encapsulation layer configured to encapsulate the display element layer and the auxiliary sensing element layer.

According to an aspect of the present disclosure, the display element layer may include light emitting devices included in the display pixels. The auxiliary sensing element layer may include auxiliary sensing electrodes included in the auxiliary pixels.

According to an aspect of the present disclosure, the circuit element layer may include transistors included in the display pixels and the auxiliary pixels.

According to an aspect of the present disclosure, the display element layer may be located in the display area.

According to an aspect of the present disclosure, the display panel may further include a driving circuit for driving the display pixels and the auxiliary pixels.

According to an aspect of the present disclosure, the driving circuit may sequentially drive the display pixels and the auxiliary pixels for each horizontal line.

According to an aspect of the present disclosure, the driving circuit may sequentially output scan signals to scan lines, and the display pixels and the auxiliary pixels may be respectively connected to the same scan lines for each horizontal line.

According to an aspect of the present disclosure, the driving circuit may be between the display unit and the auxiliary sensing unit.

According to an aspect of the present disclosure, an auxiliary pixel is connected to an ith (i is an integer of 2 or more) scan line and an auxiliary output line among the auxiliary pixel may include: an auxiliary sensing electrode; a first transistor having a gate electrode connected to the auxiliary sensing electrode, the first transistor controlling a current output through the auxiliary output line; a second transistor having a gate electrode connected to the ith scan line, the second transistor being connected between an auxiliary power line and the first transistor; a third transistor having a gate electrode connected to an (i−1)th scan line, the third transistor being connected between the auxiliary power line and the auxiliary sensing electrode; and a capacitor electrode forming a first capacitor with the auxiliary sensing electrode, the capacitor electrode being connected to the ith scan line.

According to an aspect of the present disclosure, when a touch occurs, the auxiliary sensing electrode may form a second capacitor with a finger of the user.

According to an aspect of the present disclosure, the auxiliary sensing unit may recognize the fingerprint or palm print of the user, using a change in capacitance of the second capacitor, which corresponds to the touch.

According to an aspect of the present disclosure, the input sensing unit and the auxiliary sensing unit may be directly on the display panel. The input sensing unit may include a sensing electrode, and the auxiliary sensing unit may include an auxiliary sensing electrode.

According to an aspect of the present disclosure, the sensing electrode and the auxiliary sensing electrode may have a mesh shape.

According to an aspect of the present disclosure, the sensing electrode may include first sensing electrodes and second sensing electrodes respectively corresponding to the first sensing electrodes. Each of the second sensing electrodes may include sensor parts in the same layer as the first sensing electrodes, the sensor parts being to be spaced apart from each other. The auxiliary sensing electrode may include first auxiliary sensing electrodes and second auxiliary sensing electrodes respectively corresponding to the first auxiliary sensing electrodes. Each of the second auxiliary sensing electrodes may include auxiliary sensor parts in the same layer as the first auxiliary sensing electrodes, the auxiliary sensor parts being spaced apart from each other.

According to an aspect of the present disclosure, the size of the sensor parts may be set larger than that of the auxiliary sensor parts.

According to an aspect of the present disclosure, the sensor parts and the auxiliary parts may be formed through the same process.

According to an aspect of the present disclosure, the input sensing unit and the auxiliary sensing unit may be on a base surface defined on the display panel.

According to an aspect of the present disclosure, the input sensing unit may include: a first sensing electrode including first sensor parts and first connection parts connecting the first sensor parts; and a second sensing electrode including second sensor parts and second connection parts connecting the second sensor parts. The auxiliary sensing unit may include: a first auxiliary sensing electrode including first auxiliary sensor parts and first auxiliary connection parts connecting the first auxiliary sensor parts; and a second auxiliary sensing electrode including second auxiliary sensor parts and second auxiliary connection parts connecting the second auxiliary sensor parts.

According to an aspect of the present disclosure, the first connection parts, the first auxiliary sensor parts, the second auxiliary sensor parts, and the first auxiliary connection parts are formed through the same process may be formed through the same process.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

FIG. 1B is a view illustrating an embodiment of the display device of the present disclosure.

FIG. 1C is a view illustrating another embodiment of the display device of the present disclosure.

FIG. 4 is a view illustrating a display panel according to an embodiment of the present disclosure.

FIG. 11C is a view illustrating a section of the input sensing panel shown in FIG. 11B.

DETAILED DESCRIPTION

Figure 1A:
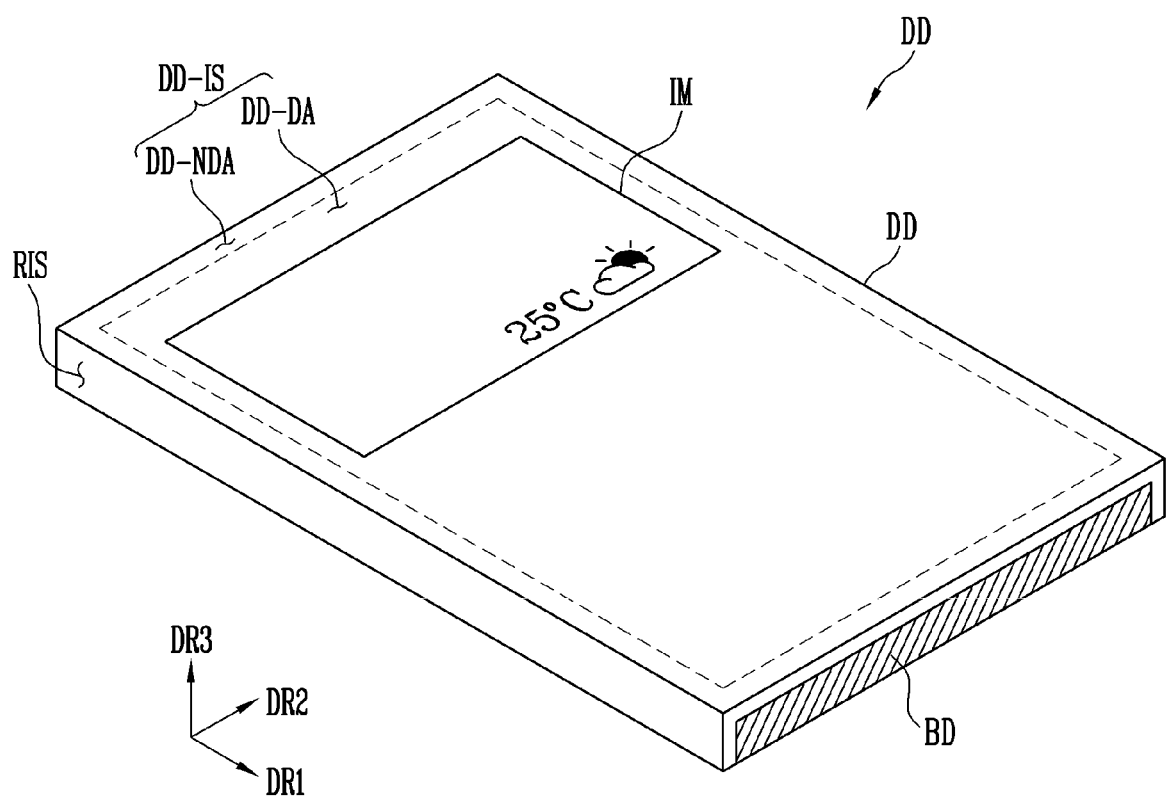
FIG. 1A is a view illustrating an embodiment of a display device of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein. FIG. 1A is a view illustrating an embodiment of a display device of the present disclosure.

As shown in FIG. 1A, the display device DD may surround a body part BD. The body part BD may include electronic modules, a camera module, a power module, and/or the like, which are mounted on a main board. The body part BD along with the display device DD may be in a bracket/case, etc., and may constitute a mobile phone terminal.

The display device DD may include a display surface DD-IS and at least one auxiliary sensing surface RIS.

The display surface DD-IS may be located at a front surface of the display device DD. The display device DD may display an image IM through the display surface DD-IS and may also sense an input (e.g., a touch, fingerprint or pressure) through the display surface DD-IS. The display surface DD-IS is parallel to a surface defined by a first direction DR1 and a second direction DR2. A normal direction of the display surface DD-IS, i.e., a thickness direction of the display device DD with respect to the display surface DD-IS indicates a third direction DR3.

The at least one auxiliary sensing surface RIS may be located at a side surface of the display device DD. The display device DD may sense an input (e.g., a touch, fingerprint or pressure) through the auxiliary sensing surface RIS. The auxiliary sensing surface RIS is parallel to a surface defined by the first direction DR1 and the third direction DR3. A normal direction of the auxiliary sensing surface RIS (i.e., a thickness direction of the display device DD with respect to the auxiliary sensing surface RIS) indicates the second direction DR2.

A front surface (or top surface) and a back surface (or bottom surface) of each member or unit described hereinbelow is distinguished by the third direction DR3. However, the first to third directions DR1, DR2, and DR3 illustrated in this embodiment are merely illustrative, and the directions indicated by the first to third directions DR1, DR2, and DR3 are relative concepts, and may be changed into other directions. Hereinafter, first to third directions are directions respectively indicated by the first to third directions DR1, DR2, and DR3, and are designated by like reference numerals.

In an embodiment of the present disclosure, the display device DD includes a planar display surface DD-IS or a planar auxiliary sensing surface RIS is illustrated, but the present disclosure is not limited thereto. The display device DD may include a curved display surface DD-IS, a curved auxiliary sensing surface RIS, a stereoscopic display surface DD-IS, or a stereoscopic auxiliary sensing surface RIS. The stereoscopic display surface DD-IS may include a plurality of display areas that indicate different directions. For example, the stereoscopic display surface DD-IS may include a polygonal pillar-shaped display surface.

The display device DD according to this embodiment may be a rigid display device. However, the present disclosure is not limited thereto, and the display device DD may be a flexible display device. In this embodiment, the display device DD is exemplarily illustrated as a mobile phone terminal. The display device DD according to the present disclosure may be applied to large-sized electronic devices such as televisions and monitors, and medium-/small-sized electronic devices such as tablet PCs, vehicle navigation systems, game consoles, and smart watches.

As shown in FIG. 1A, the display surface DD-IS includes a display area DD-DA in which the image IM is displayed and a non-display area DD-NDA adjacent to the display area DD-DA. The non-display area DD-NDA is an area in which any image is not displayed. In FIG. 1A, temperature and weather images are illustrated as an example of the image IM.

As shown in FIG. 1A, the display area DD-DA may have a quadrilateral (e.g., quadrangular) shape. The non-display area DD-NDA may surround the display area DD-DA. However, the present disclosure is not limited thereto, and the shapes of the display area DD-DA and the non-display area DD-NDA may be relatively designed.

As shown in FIG. 1A, the auxiliary sensing surface RIS may represent whole of the side surface of the display device DD, but the present disclosure is not limited thereto. Unlike as shown in FIG. 1A, the auxiliary sensing surface RIS may represent a portion of the side surface of the display device DD.

For convenience of illustration, it is assumed that the display device DD is in a state in which it is unfolded in the following drawings. Therefore, it will be readily understood that, although a case where the display device DD-IS and the at least one auxiliary sensing surface RIS are located on the same plane is illustrated in the following drawings. The display surface DD-IS may be located at the front surface of the display device DD, and the at least one auxiliary sensing surface RIS may be located at the side surface of the display device DD.

FIG. 1B is a view illustrating an embodiment of the display device of the present disclosure. For convenience of illustration, portions different from those of FIG. 1A will be mainly described.

FIG. 1B illustrates a state in which the display device DD is unfolded. As shown in FIG. 1B, the display device DD may include two auxiliary sensing surfaces RIS that extend in both directions with respect to a display surface DD-IS.

FIG. 1C is a view illustrating another embodiment of the display device of the present disclosure. For convenience of illustration, portions different from those of FIG. 1B will be mainly described.

FIG. 1C illustrates a state in which the display device DD is unfolded. As shown in FIG. 1C, the display device DD may include one auxiliary sensing surface RIS that extends in one direction with respect to a display surface DD-IS.

Hereinafter, as shown in FIG. 1C, it is assumed that the display device includes one auxiliary sensing surface RIS. However, it will be apparent that the following descriptions may be applied to the display device DD shown in FIG. 1B or a display device DD including three or more auxiliary sensing surfaces RIS.

Figure 2A:
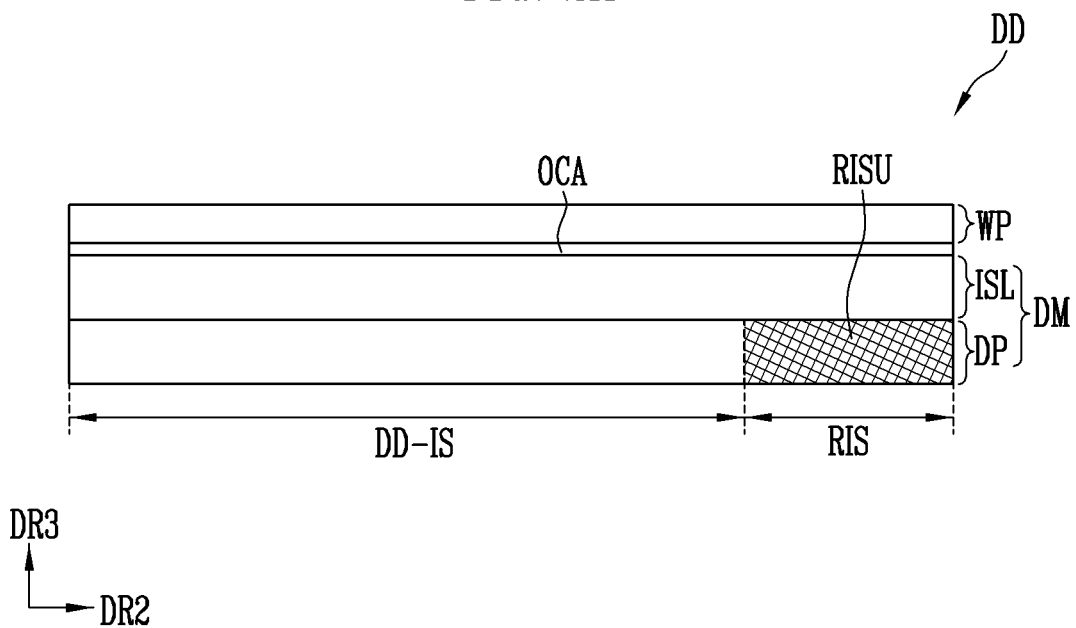
FIGS. 2A to 2C are views illustrating sections of a display device according to an embodiment of the present disclosure.
Figure 2B:
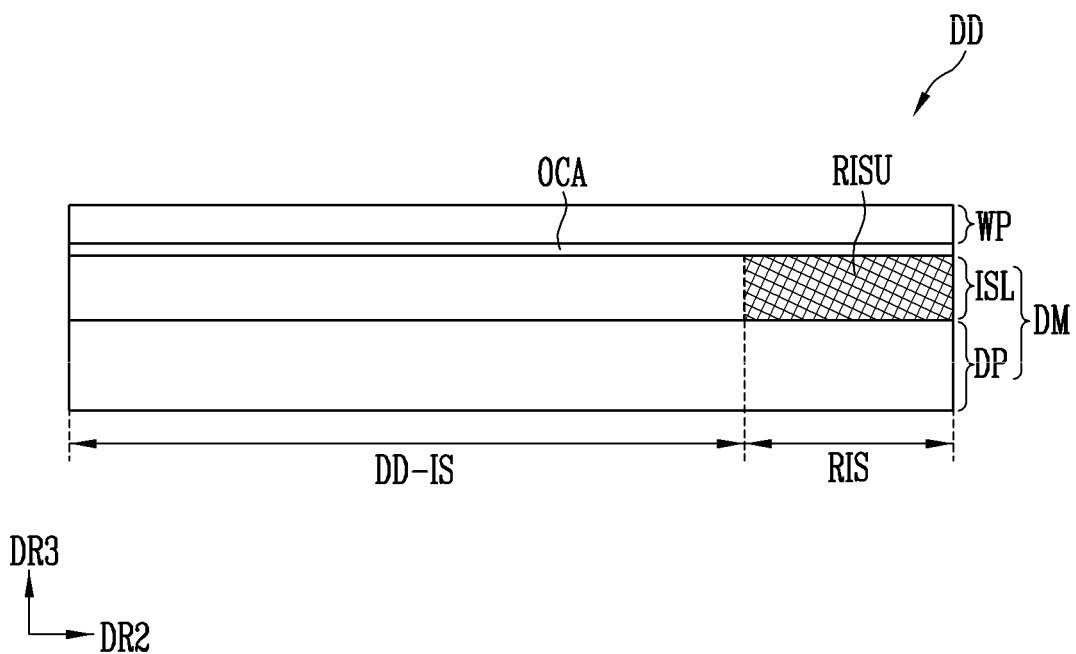
Figure 2C:
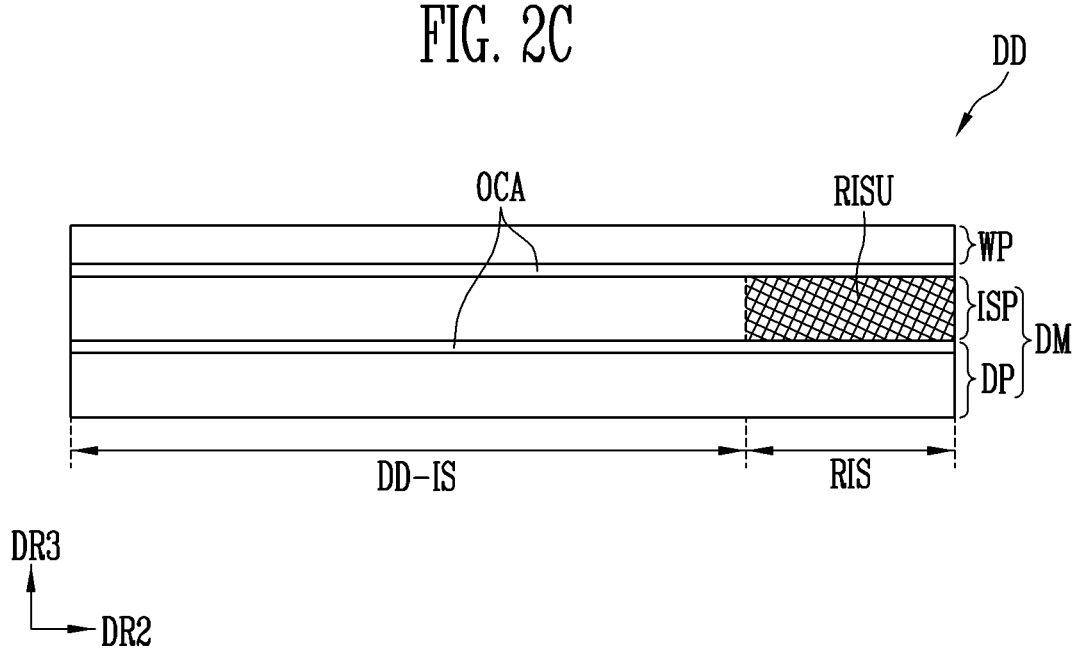

FIGS. 2A to 2C are sectional views of a display device according to an embodiment of the present disclosure. For example, FIGS. 2A to 2C may illustrate sections of an embodiment of the display device show in FIG. 1C.

FIGS. 2A to 2C illustrate sections defined by a second direction DR2 and a third direction DR3. FIGS. 2A and 2C illustrate a stacking relationship between a functional panel and/or functional units, which constitute the display device DD.

The display device DD according to the embodiment of the present disclosure may include a display panel DP, an input sensing unit, a reflection preventing unit, and a window unit. At least some components among the display panel DP, the input sensing unit, the reflection preventing unit, and the window unit may be formed by a consecutive process. Alternatively, at least some components among the display panel DP, the input sensing unit, the reflection preventing unit, and the window unit may be coupled to each other through an adhesive member. In FIGS. 2A to 2C, an optically transparent adhesive member OCA may be exemplarily illustrated as the adhesive member. The adhesive member described hereinbelow may include a general adhesive or gluing agent. In an embodiment of the present disclosure, the reflection preventing unit and the window unit may be replaced with other components or be omitted.

In FIGS. 2A to 2C, among components (e.g., the input sensing unit, the reflection preventing unit, and the window unit), a corresponding component formed with another component through a consecutive process is expressed as a "layer." Among the components (e.g., the input sensing unit, the reflection preventing unit, and the window unit), a corresponding component coupled to another component through an adhesive member is expressed as a "panel." The "panel" includes a base layer that provides a base surface, for example, a synthetic resin film, a composite material film, a glass substrate, and the like, but the base layer may be omitted in the "layer." In other words, the unit expressed as the "layer" is disposed on a base surface provided by another unit.

The input sensing unit, the reflection preventing unit, and the window unit may be designated as an input sensing panel ISP, a reflection preventing panel, and a window panel WP or an input sensing layer ISL, a reflection preventing layer, and a window layer WL according to whether the existence/nonexistence of a base layer. In some embodiments, the reflection preventing unit may be omitted.

As shown in FIG. 2A, the display device DD may include a display panel DP, an input sensing layer ISL, and a window panel WP.

The input sensing layer ISL may be directly disposed on the display panel DP. In this specification, "that component A is directly disposed on component A" means that any separate adhesive layer/adhesive member is not disposed between the component A and the component B. The component B is formed on a base surface provided by the component A through a consecutive process after the component A is formed.

The display panel DP and the input sensing layer ISL directly disposed on the display panel DP may be defined as a display module DM. An operatically transparent adhesive member OCA may be disposed between the display module DM and the window panel WP.

The display panel DP may generate an image. For example, the display panel DP may include the display area DD-DA and the non-display area DD-NDA, which are shown in FIG. 1A.

The display panel may be divided into a display surface DD-IS and an auxiliary sensing surface RIS. For example, display pixels may be arranged on the display surface DD-IS, and auxiliary pixels may be arranged on the auxiliary sensing surface RIS.

In an embodiment of the present disclosure, the display panel DP may be a light emitting display panel, but is not particularly limited. For example, the display panel DP may be an organic light emitting display panel or a quantum dot light emitting display panel. An emitting layer of the organic light emitting display panel may include an organic light emitting material. An emitting layer of the quantum dot light emitting display panel may include a quantum dot, a quantum rod, and the like. Hereinafter, the display panel DP is described as an organic light emitting display panel.

The display panel DP may include an auxiliary sensing unit RISU mounted at the auxiliary sensing surface RIS. For example, the auxiliary sensing unit RISU may be disposed at a side surface of the display device DD.

In some embodiments, the auxiliary sensing unit RISU may be formed in the same layer as the display panel DP.

In some embodiments, the auxiliary sensing unit RISU may sense at least one of a touch, a fingerprint, or a pressure.

That is, the auxiliary sensing unit RISU may acquire coordinate information or pressure information of an external input (e.g., a touch event), thereby sensing at least one of a touch, a fingerprint, or a pressure.

The auxiliary sensing unit RISU may be implemented using any one of an active-self-capacitor (ASC) method, an active-mutual-capacitor (AMC) method, a self-capacitor method, or a mutual capacitor method.

Here, the ASC method may refer to a method in which auxiliary pixels included in the auxiliary sensing unit RISU are sequentially driven, and an electrode included in the auxiliary pixels and a portion (e.g., a finger) of the body of a user form a capacitor, thereby sensing at least one of a fingerprint or a pressure.

Here, the AMC method may refer to a method in which electrodes included in the auxiliary sensing unit RISU are sequentially driven, and a capacitor formed between two electrodes included in the auxiliary sensing unit RISU is changed depending on a touch of a user, thereby sensing at least one of a fingerprint or a pressure.

Here, the self-capacitor method may refer to a method in which an electrode included in auxiliary pixels and a portion (e.g., a finger) of the body of a user form a capacitor, thereby sensing at least one of a fingerprint or a pressure.

Here, the mutual capacitor method may refer to a method in which a capacitor formed between two electrodes included in the auxiliary sensing unit RISU is changed depending on a touch of a user, thereby sensing at least one of a fingerprint or a pressure.

In some embodiments, the auxiliary sensing unit RISU may be implemented with an ultrasonic sensor or an optical sensor.

When the auxiliary sensing unit RISU is implemented with the ultrasonic sensor, the auxiliary sensing unit RISU may include ultrasonic generators and ultrasonic receivers.

When the auxiliary sensing unit RISU is implemented with the optical sensor, the auxiliary sensing unit RISU may include a light source and light receiving elements (e.g., photo diodes).

The input sensing layer ISL may acquire coordinate information or pressure information of an external input (e.g., a touch event). In an embodiment of the present disclosure, although not separately shown in the drawing, the display module DM may further include a protective member disposed on a bottom surface of the display panel DP. The protective member and the display panel DP may be coupled to each other through an adhesive member. Each of the display devices DD of FIGS. 2B and 2C, which are described hereinbelow, may further include a protective member.

A reflection preventing panel (not shown) decreases the reflexibility of external light incident from the top of the window panel WP. In an embodiment of the present disclosure, the reflection preventing panel (not shown) may include a retarder and a polarizer. The retarder may be a film type retarder or a liquid crystal coating type retarder, and include a $\lambda/2$ retarder or a $\lambda/4$ retarder. The polarizer may also be a film type polarizer or a liquid crystal coating type polarizer. The film type polarizer may include a stretched synthetic resin film, and the liquid crystal coating type polarizer may include liquid crystals arranged in a predetermined arrangement. The retarder and the polarizer may further include a protective film. The retarder and polarizer or the protective film may be defined as a base layer of the reflection preventing panel (not shown).

In an embodiment of the present disclosure, the reflection preventing panel (not shown) may include color filters. The color filters may have a predetermined arrangement. The arrangement of the color filters may be determined by considering light emitting colors of the pixels included in the display panel DP. The reflection preventing panel (not shown) may further include a black matrix adjacent to the color filters.

In an embodiment of the present disclosure, the reflection preventing panel (not shown) may include a destructive interference structure. For example, the destructive interference structure may include a first reflective layer and a second reflective layer, which are disposed on different layers. First reflected light and second reflected light, which are respectively from the first reflective layer and the second reflective layer, may destructively interfere with each other, and accordingly, the reflexibility of external light is decreased.

In an embodiment of the present disclosure, the window panel WP may include a base film and a light shielding pattern. The base film may include a glass substrate and/or a synthetic resin film. The base film is not limited to a single layer. The base film may include two or more films coupled to each other through an adhesive member.

The light shielding pattern may partially overlap with the base film. The light shielding pattern may be disposed on a back surface of the base film to define a bezel area of the display device DD, i.e., the non-display area DD-NDA (see FIGS. 1A to 1C).

The light shielding pattern may be a colored organic layer, and may be formed through coating. Although not separately shown in the drawing, the window panel WP may further include a functional coating layer disposed on a front surface of the base film. The functional coating layer may include a fingerprint preventing layer, a reflection preventing layer, a hard coating layer, and the like. In FIGS. 2A to 2C, the window panel WP is briefly illustrated without distinguishing the base film and the light shielding pattern from each other.

As shown in FIG. 2B, the pressure sensing layer ISL may include an auxiliary sensing unit RISU disposed at the auxiliary sensing surface RIS. For example the auxiliary sensing unit RISU may be disposed at a side surface of the display device DD.

In some embodiments, the auxiliary sensing unit RISU may be formed in the same layer as the input sensing layer ISL, i.e., the input sensing unit.

As shown in FIG. 2C, the display device DD may include a display panel DP, an input sensing panel ISP, and a window panel WP. The input sensing panel ISP may include an auxiliary sensing unit RISU disposed at the auxiliary sensing surface RIS. For example, the auxiliary sensing unit RISU may be disposed at a side surface of the display device DD. In some embodiments, the auxiliary sensing unit RISU may be formed in the same layer as the input sensing panel ISP, i.e., the input sensing unit.

In FIGS. 2A to 2C, the input sensing layer ISL or the input sensing panel ISP may entirely overlap with the display panel DP, but the present disclosure is not limited thereto. In some embodiments, the input sensing layer ISL or the input sensing panel ISP may partially overlap with the display panel DP.

The pitch between sensing electrodes described hereinbelow and the widths of the sensing electrodes may be changed depending on the usage of an input sensing unit. Sensing electrodes of a touch sensing panel may have a width of a few mm to a few tens mm, and sensing electrodes of a fingerprint sensing panel may have a width of a few tens μm to a few hundreds μm.

Figure 3:
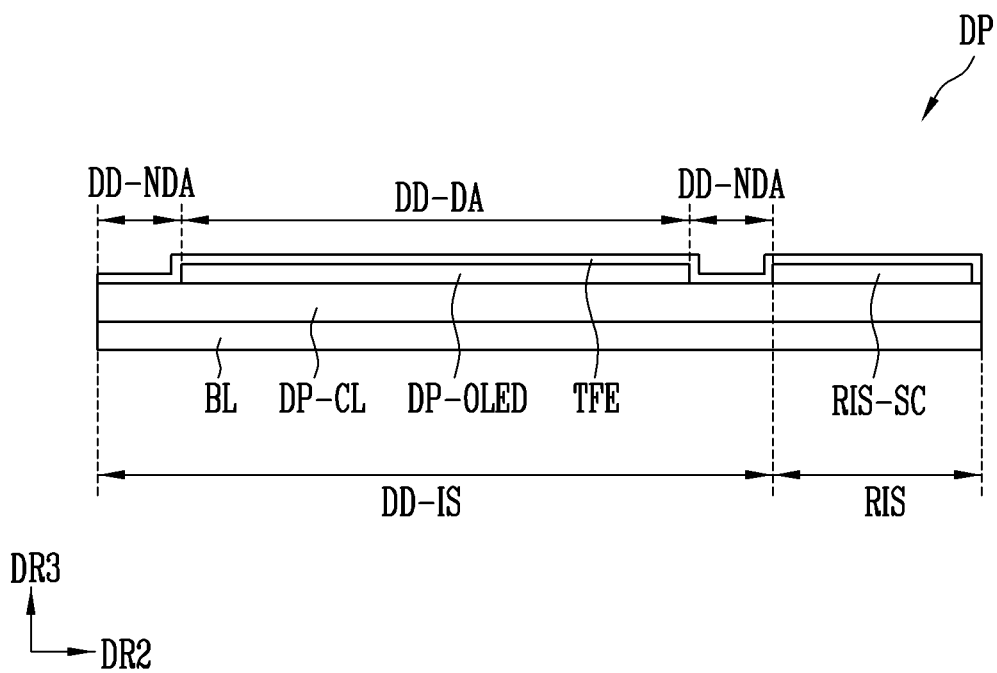
FIG. 3 is a view illustrating a section of a display panel according to an embodiment of the present disclosure.

FIG. 3 is a view illustrating a section of a display panel DP according to an embodiment of the present disclosure. For example, FIG. 3 may illustrate a section of the display panel shown in FIG. 2A.

As shown in FIG. 3, the display panel DP may include a base layer BL, a circuit element layer DP-CL disposed on the base layer BL, a display element layer DP-OLED, an auxiliary sensing element layer RIS-SC, and a thin film encapsulation layer TFE. Although not separately shown in the drawing, the display panel DP may further include functional layers such as a reflection preventing layer and a refractive index adjusting layer.

The base layer BL may include a synthetic resin film.

A synthetic resin layer is formed on a working substrate used in manufacturing of the display panel DP. Subsequently, a conductive layer, an insulating layer, and the like are formed on the synthetic resin layer. If the working substrate is removed, the synthetic resin layer corresponds to the base layer BL.

The synthetic resin layer may be a polyimide-based resin layer, and the material of the synthetic resin layer is not particularly limited. In addition, the base layer BL may include a glass substrate, a metal substrate, an organic/inorganic composite material substrate, etc.

The circuit element layer DP-CL may include at least one insulating layer and a circuit element. Hereinafter, the insulating layer included in the circuit element layer DP-CL is referred to as an intermediate insulating layer. The intermediate insulating layer may include at least one intermediate inorganic layer and at least one intermediate organic layer. The circuit element may include a signal lines, a driving circuit of a pixel, a driving circuit of an auxiliary pixel, and the like. The circuit element layer DP-CL may be formed through a process of an insulating layer, a semiconductor layer, and a conductive layer through coating, deposition, etc. and a process of patterning the insulating layer, the semiconductor layer, and the conductive layer through a photolithography process.

For example, the circuit element layer DP-CL may include transistors T1 and T2 (see FIG. 6) of a display pixel or transistors T1, T2, and T3 (see FIG. 7D) of an auxiliary pixel.

The display element layer DP-OLED may include light emitting devices of display pixels. The display element layer DP-OLED may include organic light emitting diodes. The display element layer DP-OLED may further include an organic layer such as a pixel defining layer.

For example, the display element layer DP-OLED may be located in the display area DD-DA.

The auxiliary sensing element layer RIS-SC may include auxiliary sensing electrodes of auxiliary pixels. The auxiliary sensing element layer RIS-SC may include sensing electrodes. The auxiliary sensing element layer RIS-SC may further include an elastic layer located between the sensing electrodes.

The thin film encapsulation layer TFE may encapsulate the display element layer DP-OLED and the auxiliary sensing element layer RIS-SC. The thin film encapsulation layer TFE may include at least one insulating layer. In an embodiment of the present disclosure, the thin film encapsulation layer TFE may include at least one inorganic layer (hereinafter, referred to as an encapsulation inorganic layer). In an embodiment of the present disclosure, the thin film encapsulation layer TFE may include at least one organic layer (hereinafter, referred to as an encapsulation organic layer) and at least one encapsulation inorganic layer.

The encapsulation inorganic layer may, for example, protect the display element layer DP-OLED from moisture/oxygen, and the encapsulation organic layer may, for example, protect the display element layer DP-OLED from foreign matters such as dust particles. The encapsulation inorganic layer may include a silicon nitride layer, a silicon oxynitride layer, a silicon oxide layer, a titanium oxide layer, an aluminum oxide layer, etc., but is not particularly limited. The encapsulation organic layer may include an acryl-based organic layer, but is not particularly limited.

FIG. 4 is a view illustrating a display panel according to an embodiment of the present disclosure. For example, FIG. 4 may illustrate the display panel shown in FIG. 2A.

As shown in FIG. 4, the display panel DP may include a display area DD-DA and a non-display area DD-NDA on a plane. In this embodiment, the non-display area DD-NDA may be defined along an edge of the display area DD-DA. The display area DD-DA and the non-display area DD-DA of the display panel DP may respectively correspond to the display area DD-DA and the non-display area DD-DA of the display device DD shown in FIGS. 1A to 1C.

The display panel DP may include signal lines SGGL, signal pads DP-PD, sensing pads IS-PD, auxiliary pads RIS-PD, and a display unit DU. Also, the display panel DP may further include an auxiliary sensing unit RISU.

The display unit DU may include display pixels PX, and the auxiliary sensing unit RISU may include auxiliary pixels RSPX.

The display panel DP may be divided into a display surface DD-IS and an auxiliary sensing surface RIS. The signal lines SGGL and the display unit DU may be disposed at the display surface DD-IS of the display panel DP, and the auxiliary sensing unit RISU may be disposed at the auxiliary sensing surface RIS of the display panel DP.

In addition, the signal pads DP-PD, the sensing pads IS-PD, and the auxiliary pads RIS-PD may be disposed at the display surface DD-IS of the display panel DP. However, the present disclosure is not limited thereto.

Although omitted in FIG. 4, the signal lines SGGL may be disposed throughout the display area DD-DA and the non-display area DD-NDA. The signal lines SGGL may include a pad part and a line part.

The line part may be a part disposed in the display area DD-DA and the non-display area DD-NDA, and the pad part may be a part connected to an end of the line part.

The line part connected to the display pixels PX may occupy a majority of the signal lines SGGL. The line part may be connected to transistors T1 and T2 (see FIG. 5) of the display pixel PX or transistors T1, T2, and T3 (see FIG. 7D) of the auxiliary pixel RSPX.

The line part may have a single-/multi-layered structure. The line part may be an integrated single body or include two or more portions. The two or more portions may be disposed on different layers, and be connected to each other through a contact hole passing through an insulating layer disposed between the two or more portions.

The pad part may overlap with a corresponding pad among the signal pads DP-PD, the sensing pads IS-PD, and the auxiliary pads RIS-PD.

The area in which the signal pads DP-PD, the sensing pads IS-PD, and the auxiliary pads RIS-PD are disposed may be defined as a pad area NDA-PD.

The signal pads DP-PD and the auxiliary pads RIS-PD may be electrically connected to a corresponding signal line among the signal lines SGGL.

The sensing pads IS-PD may be selectively provided in the display panel DP of FIGS. 2A and 2B. The sensing pads IS-PD may be omitted in the display panel DP of FIG. 2C.

The sensing pads IS-PD may overlap with a pad part of signal lines provided in the input sensing layer ISL shown in FIGS. 2A and 2B. The sensing pads IS-PD may be floating electrodes. The sensing pads IS-PD may be electrically insulated from the signal lines SGGL of the display panel DP.

The signal pads DP-PD, the sensing pads IS-PD, and the auxiliary pads RIS-PD may be formed through the same process as the signal lines SGGL, and be disposed on the same layer as the signal lines SGGL.

The display pixels PX may be arranged in the display area DD-DA. Each of the display pixels PX may include an organic light emitting diode and a pixel driving circuit connected thereto. Each of the auxiliary pixels RSPX may include an auxiliary sensing electrode and an auxiliary pixel driving circuit connected thereto.

The signal lines SGGL, the signal pads DP-PD, the sensing pads IS-PD, the auxiliary pads RIS-PD, the pixel driving circuit, and the auxiliary pixel driving circuit may be included in the circuit element layer DP-CL shown in FIG. 3.

In FIG. 4, a circuit board PCB electrically connected to the display panel DP is additionally illustrated. The circuit board PCB may be a rigid circuit board or a flexible circuit board. The circuit board PCB may be directly coupled to the display panel DP, or be connected to the display panel DP through another circuit board.

A timing control circuit TC for controlling an operation of the display panel DP may be disposed on the circuit board PCB. In addition, an input sensing circuit IS-C for controlling the input sensing panel ISP or the input sensing layer ISL may be disposed on the circuit board PCB. Each of the timing control circuit TC and the input sensing circuit ISC may be mounted in the form of an integrated chip (IC) on the circuit board PCB. In an embodiment of the present disclosure, the timing control circuit TC and the input sensing circuit IS-C may be mounted in the form of one IC on the circuit board PCB. The circuit board PCB may include circuit board pads PCB-P electrically connected to the display panel DP. Although not shown in the drawing, the circuit board PCB may further include signal lines for connecting the circuit board pads PCB-P to the timing control circuit TC and/or the input sensing circuit IS-C.

Unlike as shown in FIG. 4, the display panel DP according to the embodiment of the present disclosure may further include a chip mounting area disposed in the non-display area DD-NDA.

In some embodiments, at least one of the timing control circuit TC and the input sensing circuit IS-C, which are mounted in the form of an IC on the circuit board PCB, may be mounted in the chip mounting area.

Figure 5A:
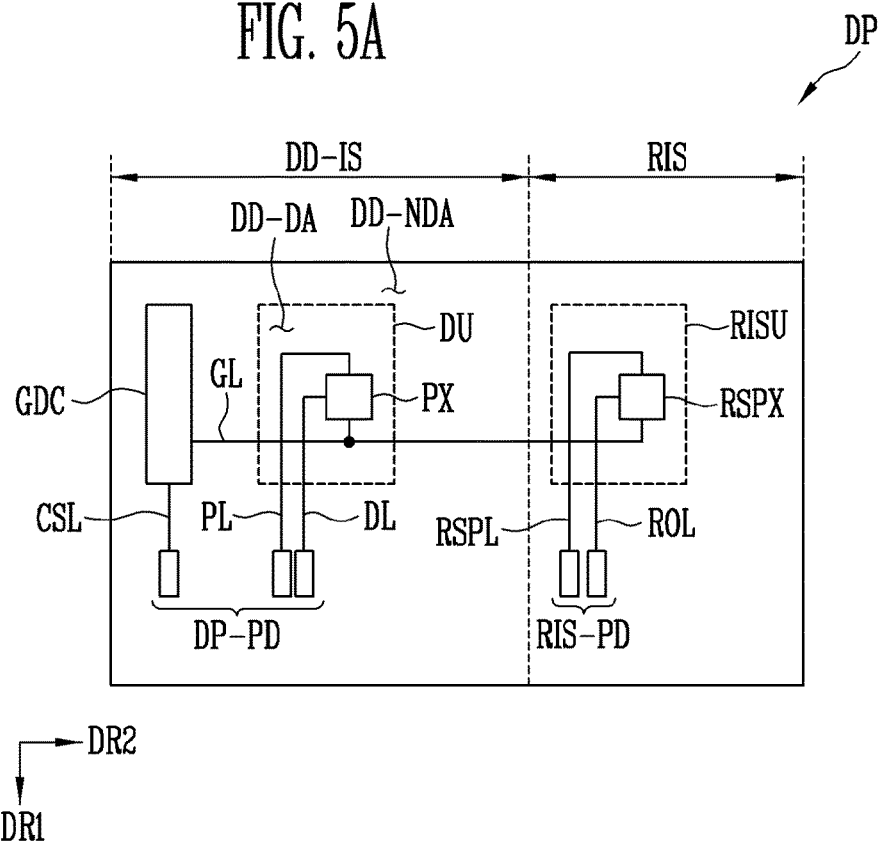
FIGS. 5A and 5B are views schematically illustrating an embodiment of the display panel according to the embodiment of the present disclosure.
Figure 5B:
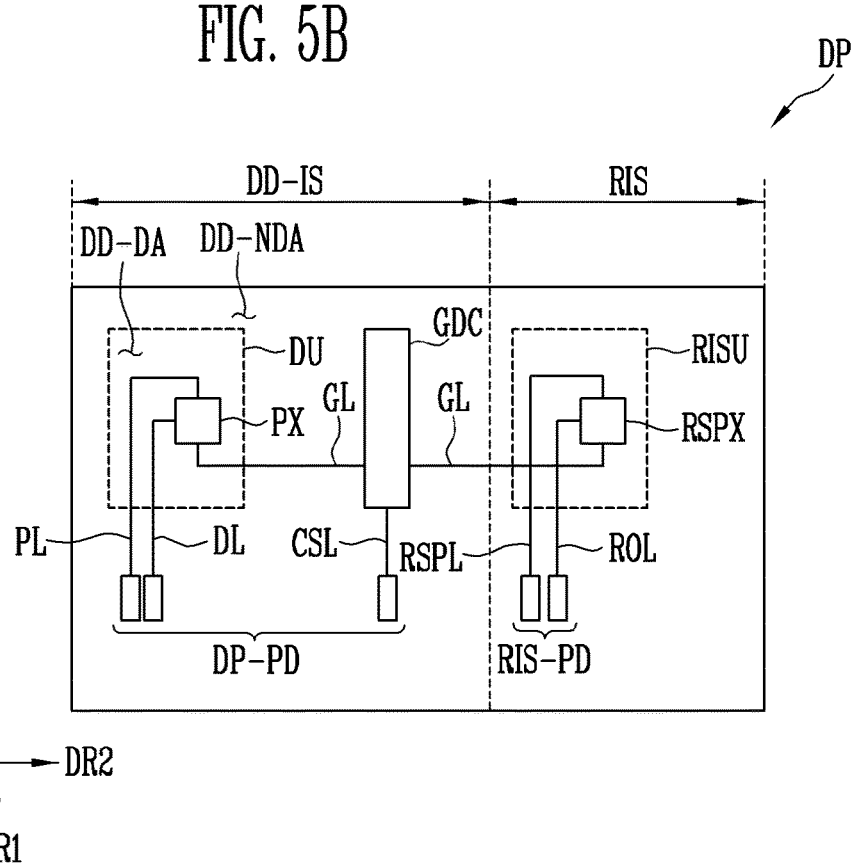

FIGS. 5A and 5B are views schematically illustrating an embodiment of the display panel shown in FIG. 4, with an auxiliary sensing unit RISU implemented using an active-self-capacitor (ASC) method.

For convenience of description, only one of the display pixels PX shown in FIG. 4 and components corresponding thereto are illustrated in FIGS. 5A and 5B.

In FIGS. 5A and 5B, contents overlapping with those of FIG. 4 will be omitted to avoid redundancy.

As shown in FIGS. 5A and 5B, the display panel DP may include a driving circuit GDC, a display unit DU, and an auxiliary sensing unit RISU. Also, the display panel DP may include signal pads DP-PD and auxiliary pads RIS-PD.

For convenience of description, a case where the auxiliary pads RIS-PD are disposed at an auxiliary sensing surface RIS of the display panel DP is illustrated in FIGS. 5A and 5B, but the present disclosure is not limited thereto.

The driving circuit GDC, the signal lines SGGL, the signal pads DP-PD, and the pixel driving circuit may be included in the circuit element layer DP-CL shown in FIG. 3.

An embodiment in which the driving circuit GDC is disposed at one side of the display unit DU and the auxiliary sensing unit RISU is illustrated in FIG. 5A, and an embodiment in which the driving circuit GDC is disposed between the display unit DU and the auxiliary sensing unit RISU is illustrated in FIG. 5B. However, the present disclosure is not limited thereto. In some embodiments, the driving circuit GDC may be disposed at various positions.

The driving circuit GDC may include a scan driving circuit. The scan driving circuit may generate scan signals and sequentially output the scan signals to scan lines GL. In some embodiments, the scan driving circuit may further output another control signal to the driving circuit of the display pixels PX. That is, the driving circuit GDC may sequentially drive the display pixels PX and the auxiliary pixels RSPX for each horizontal line.

The scan driving circuit may include a plurality of thin film transistors formed through the same process as the driving circuit of the display pixels PX (e.g., a low temperature polycrystalline silicon (LTPS) process or a low temperature polycrystalline oxide (LTPO) process).

The signal lines SGGL shown in FIG. 4, may include scan lines GL, data lines DL, a power line PL, and a control signal line CSL. Also, the signal lines SGGL may further include auxiliary output lines ROL and an auxiliary power line RSPL.

Each of the scan lines GL may be connected to a corresponding auxiliary pixel among the auxiliary pixels RSPX while being connected to a corresponding display pixel among the display pixels PX. That is, the corresponding display pixel and the corresponding auxiliary pixel may be connected to the same scan line GL. For example, display pixels PX and auxiliary pixels RSPX may be connected to the same scan line GL for each horizontal line.

The data lines DL and the power line PL may be connected to the display pixels PX.

The control signal line CSL may be connected to the driving circuit GDS.

The auxiliary output lines ROL and the auxiliary power line RSPL may be connected to the auxiliary pixels RSPX.

Figure 6:
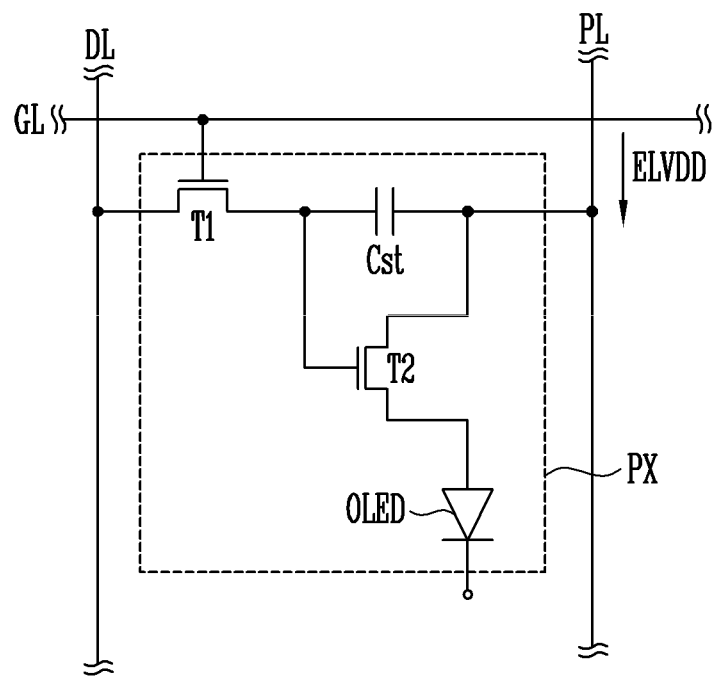
FIG. 6 is a view illustrating a display pixel according to an embodiment of the present disclosure.

FIG. 6 is a view illustrating a display pixel according to an embodiment of the present disclosure. FIG. 6 includes an equivalent circuit diagram of a display pixel PX according to an embodiment of the present disclosure.

Any one scan line GL, any one data line DL, a power line PL, and a display pixel PX connected thereto are illustrated in FIG. 6. The configuration of the display pixel PX is not limited to FIG. 6 and may be modified.

An organic light emitting diode OLED may be a top-emission type light emitting diode or a bottom-emission type light emitting diode. The display pixel PX includes a first transistor (or switching transistor) T1, a second transistor (or driving transistor) T2, and a capacitor Cst, which constitute a pixel driving circuit for driving the organic light emitting diode OLED. A first power voltage ELVDD is provided to the second transistor T2, and a second power voltage ELVSS is provided to the organic light emitting diode OLED. The second power voltage ELVSS may be a voltage lower than the first power voltage ELVDD.

The first transistor T1 outputs a data signal applied to the data line DL in response to a scan signal applied to the scan line GL. The capacitor Cst charges a voltage corresponding to the data signal received from the first transistor T1. The second transistor T2 is connected to the organic light emitting diode OLED. The second transistor T2 controls a driving current flowing through the organic light emitting diode OLED, corresponding to the quantity of charges stored in the capacitor Cst.

The equivalent circuit of FIG. 6 is merely an embodiment, and the present disclosure is not limited thereto. The display pixel PX may further include a plurality of transistors and a plurality of capacitors. The organic light emitting diode OLED may be connected between the power line PL and the second transistor T2.

FIGS. 7A to 7E are views illustrating an auxiliary pixel RSPX using an active-self-capacitor (ASC) method.

Figure 7A:
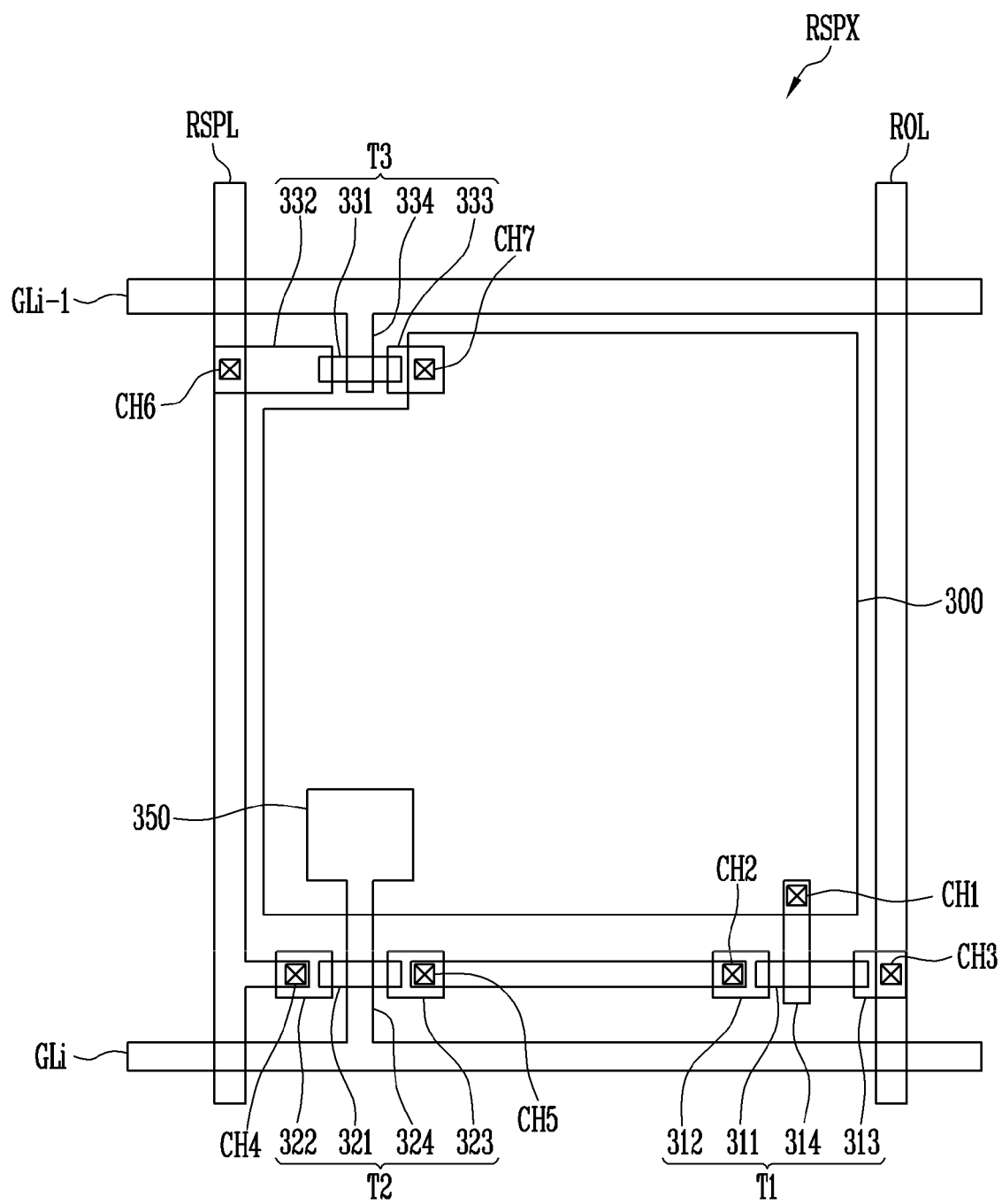
FIG. 7A is a view illustrating an auxiliary pixel according to an embodiment of the present disclosure.

FIG. 7A is a view illustrating an auxiliary pixel according to an embodiment of the present disclosure. For example, FIG. 7A may illustrate the auxiliary pixel shown in FIG. 5.

For convenience of description, an auxiliary pixel RSPX connected to an ith scan line GLi and any one auxiliary output line ROL is illustrated in FIG. 7A (here, i is an integer of 2 or more).

Referring to FIG. 7A, the auxiliary pixel RSPX according to the embodiment of the present disclosure may include an auxiliary sensing electrode 300, a first transistor T1, a second transistor T2, a third transistor T3, and a capacitor electrode 350.

The first transistor T1 may control a current flowing in an auxiliary output line ROL. To this end, the first transistor T1 may be connected between the auxiliary output line ROL and the second transistor T2.

For example, the first transistor T1 may include a first electrode 312 connected to a second electrode 323 of the second transistor T2, a second electrode 313 connected to an auxiliary output line ROL, a gate electrode 314 connected to the auxiliary sensing electrode 300, and a semiconductor layer 311 connected between the first electrode 312 and the second electrode 313.

In addition, the gate electrode 314, the first electrode 312, and the second electrode 313 of the first transistor T1 may be connected to other components through contact holes CH1, CH2, and CH3, respectively.

The first transistor T1 may control a current Io output to the auxiliary output line ROL, corresponding to a potential of the auxiliary sensing electrode 300.

The second transistor T2 may be connected between an auxiliary power line RSPL and the first transistor T1.

For example, the second transistor T2 may include a first electrode 322 connected to the auxiliary power line RSPL, the second electrode 323 connected to the first electrode 312 of the first transistor T1, a gate electrode 324 connected to an ith scan line GLi, and a semiconductor layer 321 connected between the first electrode 322 and the second electrode 323.

In addition, the first electrode 322 and the second electrode 323 of the second transistor T2 may be connected to other components through contact holes CH4 and CH5, respectively.

The second transistor T2 may be turned on when a sensor scan signal is supplied to the ith scan line GLi. If the second transistor T2 is turned on, a reference voltage may be applied to the first electrode 312 of the first transistor T1.

The third transistor T3 may be connected between the auxiliary power line RSPL and the auxiliary sensing electrode 300.

For example, the third transistor T3 may include a first electrode 332 connected to the auxiliary power line RSPL, a second electrode 333 connected to the auxiliary sensing electrode 300, a gate electrode 334 connected to an (i−1)th scan line GLi−1, and a semiconductor layer 331 connected between the first electrode 332 and the second electrode 333.

In addition, the first electrode 332 and the second electrode 333 of the third transistor T3 may be connected to other components through contact holes CH6 and CH7, respectively.

Therefore, the third transistor T3 may be turned on when a sensor scan signal is supplied to the (i−1)th scan line GLi−1. If the third transistor T3 is turned on, a voltage of the auxiliary sensing electrode 300 may be initialized to the reference voltage.

The capacitor electrode 350 may be located to overlap with the auxiliary sensing electrode 300. Accordingly, the capacitor electrode 350 along with the auxiliary sensing electrode 300 can form a capacitor.

Also, the capacitor electrode 350 may be connected to the ith scan line GLi. For example, the capacitor electrode 350 may be connected to the ith scan line GLi through the gate electrode 324 of the second transistor T2.

At this time, the capacitor electrode 350 and the gate electrode 324 of the second transistor T2 may be formed of the same material as the ith scan line GLi.

The auxiliary sensing electrode 300 may form a capacitor with the capacitor electrode 350 and a finger of a user, etc.

Also, the auxiliary sensing electrode 300 may include a conductive material. For example, the conductive material may include metals, alloys thereof, a conductive polymer, a conductive metal oxide, and the like.

Examples of the metals may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like.

In addition, examples of the conductive polymer may be polythiophene-based, polypyrrole-based, polyaniline-based, polyacetylene-based, and polyphenylene-based compounds, mixtures thereof, and the like. A PEDOT/PSS compound among the polythiophene-based compounds may be used as the conductive polymer.

Examples of the conductive metal oxide may be indium tin oxide (ITO), indium zinc oxide (IZO), antimony zinc oxide (AZO), indium tin zinc oxide (ITZO), zinc oxide (ZnO), tin oxide ($SnO_2$), and the like.

Figure 7B:
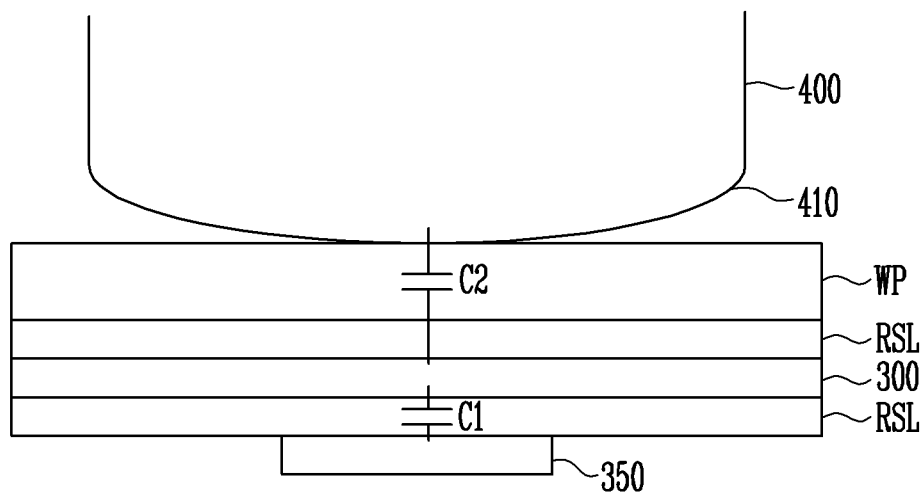
FIG. 7B is a view illustrating a structure of the auxiliary pixel according to an embodiment of the present disclosure.
Figure 7C:
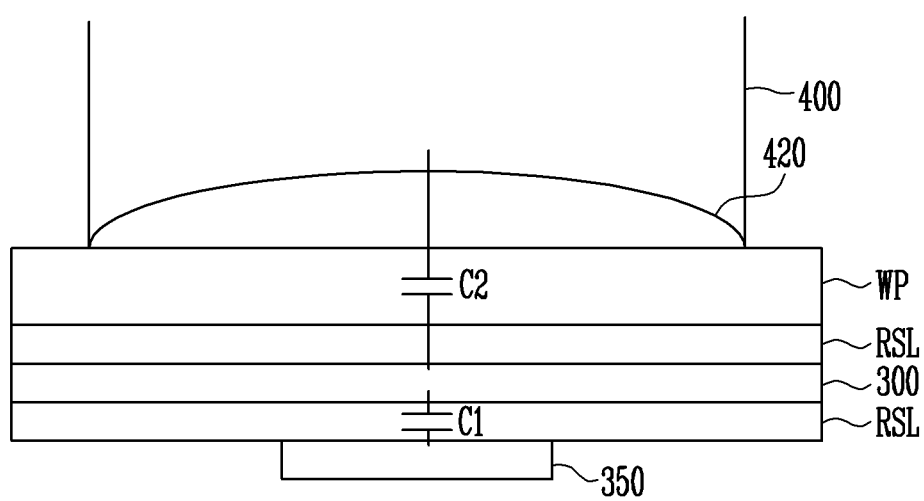
FIG. 7C is a view illustrating a structure of the auxiliary pixel according to an embodiment of the present disclosure.

FIGS. 7B and 7C are sectional views of a sensor pixel according to an embodiment of the present disclosure. For example, FIGS. 7B and 7C may illustrate a structure of the auxiliary pixel shown in FIG. 5.

FIGS. 7B and 7C also illustrate that a capacitance of a second capacitor C2 related to the auxiliary sensing electrode 300 is changed depending on a ridge 410 and a valley 420 of a fingerprint.

In particular, a case where a ridge 410 of a finger 400 is located on the auxiliary pixel RSPX is illustrated in FIG. 7B, and a case where a valley 420 of the finger 400 is located on the auxiliary pixel RSPX is illustrated in FIG. 7C.

An elastic insulating layer RSL may be located on the capacitor electrode 350, and an auxiliary sensing electrode 300 may be located on the elastic insulating layer RSL.

The auxiliary sensing electrode 300 and the capacitor electrode 350 may form a first capacitor C1. The auxiliary sensing electrode 300 and the capacitor electrode 350 may be located to be spaced apart from each other with the elastic insulating layer RSL interposed therebetween.

An elastic insulating layer RSL may be located on the auxiliary sensing electrode 300, and a window panel WP may be located on the elastic insulating layer RSL.

The finger 400 of a user may be in contact with the window panel WP.

In addition, when the finger 400 of the user is located on the auxiliary pixel RSPX to recognize a fingerprint, the auxiliary sensing electrode 300 and the finger 400 may form the second capacitor C2.

At this time, the second capacitor C2 is a variable capacitor, and a capacitance of the second capacitor C2 may be changed depending on whether the ridge 410 or the valley 420 of the fingerprint is located on the auxiliary sensing electrode 300.

That is, because the distance between the ridge 410 and the auxiliary sensing electrode 300 is shorter than that between the valley 420 and the auxiliary sensing electrode 300, a capacitance of the second capacitor C2 when the ridge 410 is located on the auxiliary sensing electrode 300 as shown in FIG. 7B is different from that of the second capacitor C2 when the valley 420 is located on the auxiliary sensing electrode 300 as shown in FIG. 7A.

Referring to FIGS. 7A to 7C, a change in capacitance of the second capacitor C2 has influence on an output current of the auxiliary pixel RSPX, and a fingerprint or palm print of the user may be sensed based on a change in output current.

In addition, the elastic insulating layer RSL may have elasticity. The elastic insulating layer having elasticity may have a thickness changed depending on a pressure applied thereto. If the thickness of the elastic insulating layer RSL is changed, the capacitance of the first capacitor C1 or the second capacitor C2 may be changed.

Such a change in capacitance has influence on the output current of the auxiliary pixel RSPX, and a pressure may be sensed based on a change in output current.

However, the present disclosure is not limited thereto, and the auxiliary pixel RSPX may be designed in various manners so as to sense a pressure.

Figure 7D:
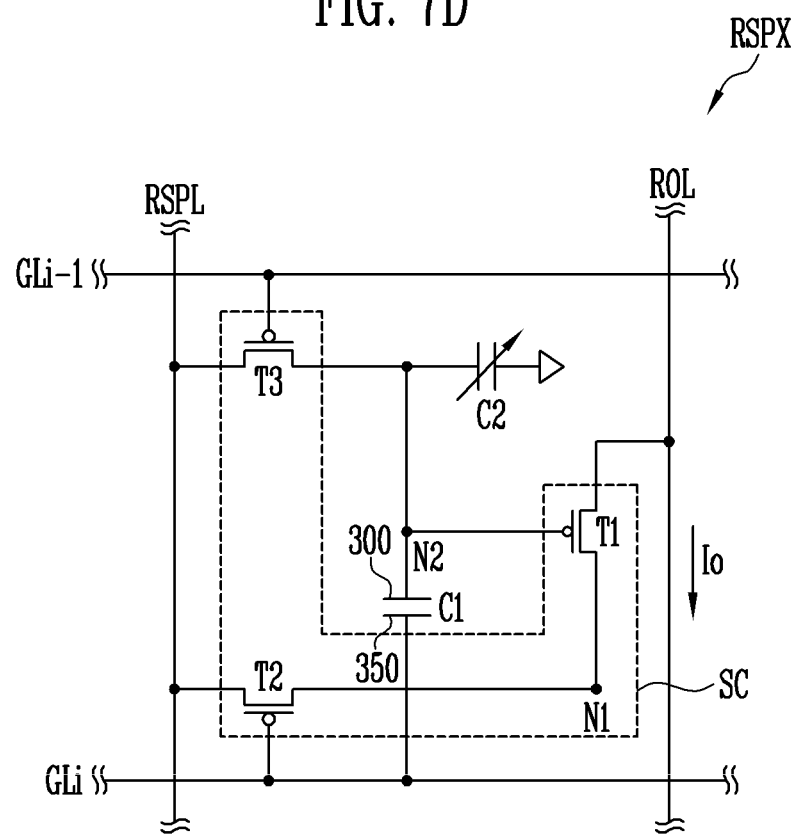
FIG. 7D is a circuit diagram illustrating an equivalent circuit of the auxiliary pixel according to an embodiment of the present disclosure.
Figure 7E:
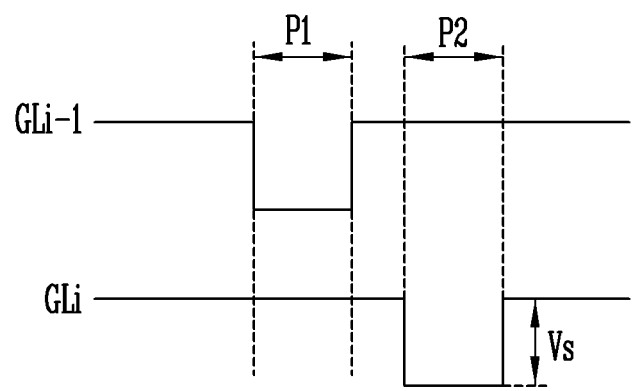
FIG. 7E is a timing diagram illustrating an operation of the auxiliary pixel shown in FIG. 7D.

FIG. 7D is a view illustrating an equivalent circuit of the auxiliary pixel according to an embodiment of the present disclosure. FIG. 7E is a timing diagram illustrating an operation of the auxiliary pixel shown in FIG. 7D.

For convenience of description, an auxiliary pixel RSPX connected to an ith scan line GLi, an (i−1)th scan line GLi−1, and an auxiliary output line ROL is illustrated in FIG. 7D. Also, a scan signal supplied to the (i−1)th scan line GLi−1 and a scan signal supplied to the ith scan line Si are illustrated in FIG. 7E.

Referring to FIG. 7D, the auxiliary pixel RSPX may include an auxiliary sensing electrode 300, a capacitor electrode 350, a first transistor T1, a second transistor T2, and a third transistor T3.

As described above, the auxiliary sensing electrode 300 and the capacitor electrode 350 may constitute a first capacitor C1, and the first transistor T1, the second transistor T2, and the third transistor T3 may constitute an auxiliary pixel driving circuit SC.

In addition, a second capacitor C2 is a variable capacitor, and may be configured with the auxiliary sensing electrode 300 and the finger 400 as described above. At this time, a capacitance of the second capacitor C2 may be changed depending on the distance between the auxiliary sensing electrode 300 and the finger 400, whether a ridge or valley of a fingerprint is located on the auxiliary sensing electrode 300, the intensity of a pressure caused by a touch, etc.

The first transistor T1 may control a current flowing in an auxiliary output line ROL. The first transistor T1 may be connected between the auxiliary output line ROL and the second transistor T2.

In other words, the first transistor T1 may be connected between the auxiliary output line ROL and a first node N1, and a gate electrode of the first transistor T1 may be connected to a second node N2.

For example, the first transistor T1 may include a first electrode connected to a second electrode of the second transistor T2, a second electrode connected to the auxiliary output line ROL, and the gate electrode connected to the auxiliary sensing electrode 300.

The second transistor T2 may be connected between an auxiliary power line RSPL and the first transistor T1.

In other words, the second transistor T2 may be connected between the auxiliary power line RSPL and the first node N1, and a gate electrode of the second transistor T2 may be connected to the ith scan line GLi.

For example, the second transistor T2 may include a first electrode connected to the auxiliary power line RSPL, the second electrode connected to the first electrode of the first transistor T1, and the gate electrode connected to the first scan line GLi.

Therefore, the second transistor T2 may be turned on when a scan signal is supplied to the ith scan line GLi. If the second transistor T2 is turned on, a reference voltage may be applied to the first electrode of the first transistor T1.

The third transistor T3 may be connected between the auxiliary power line RSPL and the auxiliary sensing electrode 300.

In other words, the third transistor T3 may be connected between the second node N2 and the auxiliary power line RSPL, and a gate electrode of the third transistor T3 may be connected to the (i−1)th scan line GLi−1.

For example, the third transistor T3 may include a first electrode connected to the auxiliary power line RSPL, a second electrode connected to the auxiliary sensing electrode 300, and the gate electrode connected to the (i−1)th scan line GLi−1.

Therefore, the third transistor T3 may be turned on when a scan signal is supplied to the (i−1)th scan line GLi−1. If the third transistor T3 is turned on, a voltage of the auxiliary sensing electrode 300 may be initialized to the reference voltage.

The capacitor electrode 350 may be located to overlap with the auxiliary sensing electrode 300. Accordingly, the capacitor electrode 350 along with the auxiliary sensing electrode 300 can form the first capacitor C1.

Also, the capacitor electrode 350 may be connected to the ith scan line GLi.

Therefore, the first capacitor C1 may be connected between the second node N2 and the ith scan line GLi.

In addition, the second capacitor C2 may be connected to the second node N2.

The first node N1 is a node to which the first electrode of the first transistor T1 and the second electrode of the second transistor T2 are commonly connected, and the second node N2 is a node to which the auxiliary sensing electrode 300, the gate electrode of the first transistor T1, and the second electrode of the third transistor T3 are commonly connected.

Here, the first electrode of each of the transistors T1, T2, and T3 may be set as any one of a source electrode and a drain electrode, and the second electrode of each of the transistors T1, T2, and T3 may be set as an electrode different from the first electrode. For example, if the first electrode is set as the source electrode, the second electrode may be set as the drain electrode.

In addition, a case where the transistors T1, T2, and T3 are POMS transistors is exemplarily illustrated in FIG. 7D. However, in another embodiment, the transistors T1, T2, and T3 may be implemented with NMOS transistors.

FIG. 7E is a timing diagram illustrating an operation of the auxiliary pixel shown in FIG. 7D.

Referring to FIG. 7E, a scan signal may be supplied to the (i−1)th scan line GLi−1 during a first period P1.

Therefore, in the first period, the third transistor T3 may maintain an on state, and the second node N2 may be initialized to the reference voltage applied from the auxiliary power line RSPL.

After that, a scan signal may be supplied to the ith scan line GLi during a second period P2.

Therefore, in the second period P2, the second transistor T2 may maintain the on state, and a current may flow in the auxiliary output line ROL via the second transistor T2 and the first transistor T1 from the auxiliary power line RSPL.

At this time, the first transistor T1 may control the amount of output current, corresponding to a gate voltage (a voltage of the second node N2).

For example, the output current may be changed depending on a gate voltage Vg of the first transistor T1. The gate voltage Vg of the first transistor T1 may be determined according to the following equation.

$Vg=Vcom+\{Vc1/(Vc1+Vc2)\}*Vs$ (Vcom is a reference voltage, Vc1 is a capacitance of the first capacitor C1, Vc2 is a capacitance of the second capacitor C2, and Vs is a variation in voltage of the sensor scan signal supplied to the ith scan line GLi)

Figure 8:
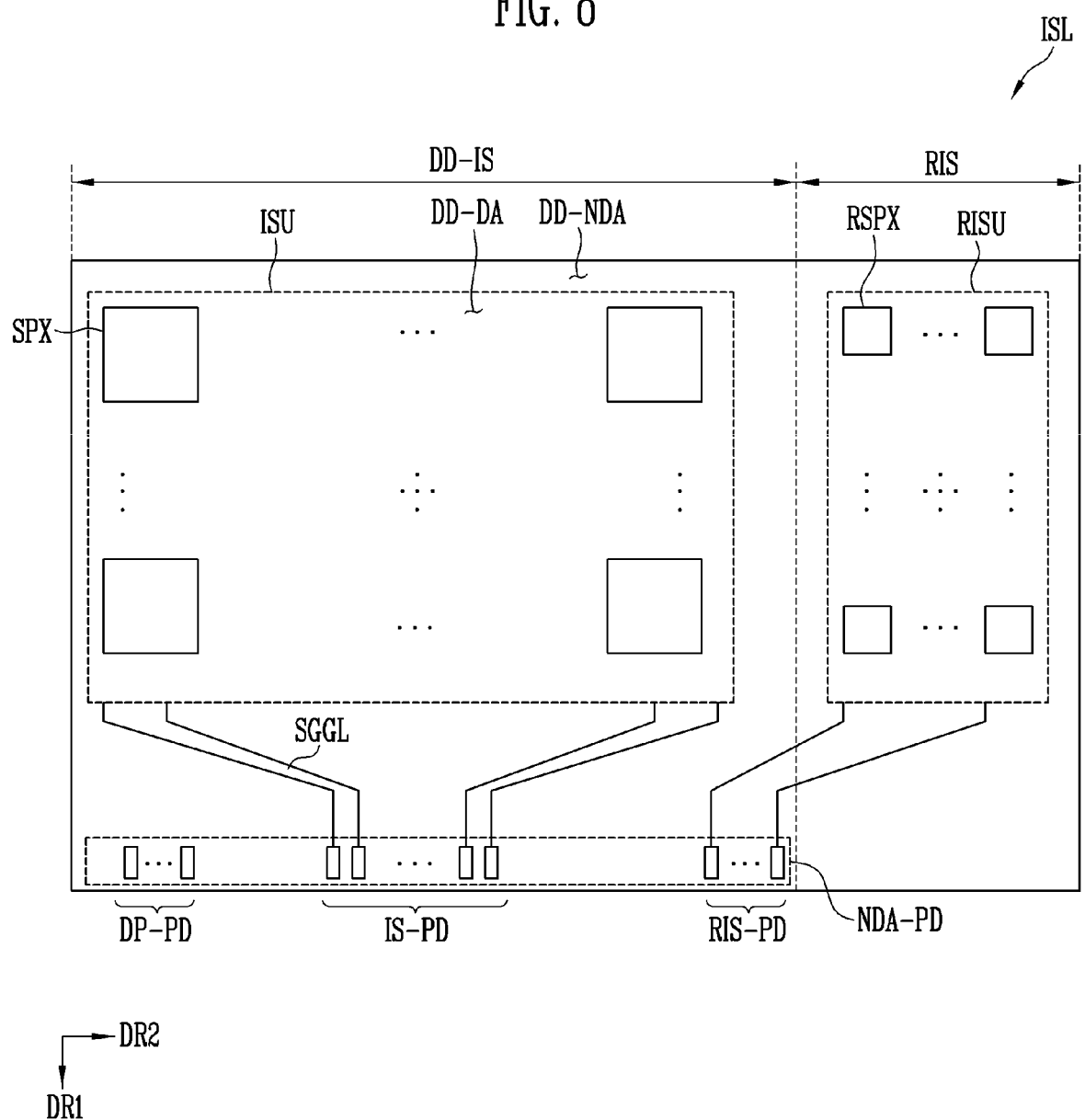
FIG. 8 is a view illustrating an input sensing layer according to an embodiment of the present disclosure.

FIG. 8 is a view illustrating an input sensing layer ISL according to an embodiment of the present disclosure. For example, FIG. 8 may illustrate the input sensing layer ISL shown in FIG. 2B.

As shown in FIG. 8, the input sensing layer ISL may include a display area DD-DA and a non-display area DD-NDA on a plane. In this embodiment, the non-display area DD-NDA may be defined along an edge of the display area DD-DA. The display area DD-DA and the non-display area DD-DA of the input sensing layer ISL may respectively correspond to the display area DD-DA and the non-display area DD-DA of the display device DD shown in FIGS. 1A to 1C.

The input sensing layer ISL may include signal lines SGGL, signal pads DP-PD, sensing pads IS-PD, auxiliary pads RIS-PD, and an input sensing unit ISU. Also, the input sensing layer ISL may further include an auxiliary sensing unit RISU.

The input sensing unit ISU may include sensing pixels SPX, and the auxiliary sensing unit RISU may include auxiliary pixels RSPX.

The input sensing unit ISU may be disposed at a front surface of the display device DD (see FIG. 1A), and the auxiliary sensing unit RISU may be disposed at a side surface of the display device DD.

In some embodiments, the input sensing unit ISU may be implemented with a touch sensor for sensing a touch or a fingerprint sensor for sensing a fingerprint or a palm print.

In addition, the auxiliary sensing unit RISU may be implemented with a fingerprint sensor for sensing a fingerprint or a palm print.

The input sensing layer ISL may be divided into a display surface DD-IS and an auxiliary sensing surface RIS. The input sensing unit ISU may be disposed at the display surface DD-IS of the input sensing layer ISL, and the auxiliary sensing unit RISU may be disposed at the auxiliary sensing surface RIS of the input sensing layer ISL.

In addition, the signal pads DP-PD, the sensing pads IS-PD, and the auxiliary pads RIS-PD may be disposed at the display surface DD-IS of the input sensing layer ISL. However, the present disclosure is not limited thereto.

The signal lines SGGL may be disposed throughout the whole of the input sensing layer ISL. The signal lines SGGL may include a pad part and a line part.

The line part may be a part disposed throughout the whole of the input sensing layer ISL, and the pad part may be a part connected to an end of the line part.

The line part connected to the sensing pixels SPX may occupy a majority of the signal lines SGGL. The line part may be connected to the sensing pixels SPX or the auxiliary pixels RSPX.

The line part may have a single or multi-layered structure. The line part may be an integrated single body or include two or more portions. The two or more portions may be disposed on different layers, and be connected to each other through a contact hole passing through an insulating layer disposed between the two or more portions.

The pad part may overlap with a corresponding pad among the sensing pads IS-PD and the auxiliary pads RIS-PD.

The area in which the signal pads DP-PD, the sensing pads IS-PD, and the auxiliary pads RIS-PD may be defined as a pad area NDA-PD.

The sensing pads IS-PD and the auxiliary pads RIS-PD may be electrically connected to a corresponding signal line among the signal lines SGGL.

The signal pads DP-PD may be selectively provided in the input sensing layer ISL of FIGS. 2A and 2B. The signal pads DP-PD may be omitted in the input sensing panel ISP of FIG. 2C.

The signal pads DP-PD may overlap with a pad part of signal lines provided in the display panel shown in FIGS. 2A and 2B. The signal pads DP-PD may be floating electrodes. The signal pads DP-PD may be electrically insulated from the signal lines SGGL of the input sensing layer ISL.

The signal pads DP-PD, the sensing pads IS-PD, and the auxiliary pads RIS-PD may be formed through the same process as the signal lines SGGL, and be disposed on the same layer as the signal lines SGGL.

The sensing pixels SPX may be arranged in the display area DD-DA. Each of the sensing pixels SPX may include a sensing electrode and a sensing pixel driving circuit connected thereto. Each of the auxiliary pixels RSPX may include an auxiliary sensing electrode and an auxiliary pixel driving circuit connected thereto.

Figure 9A:
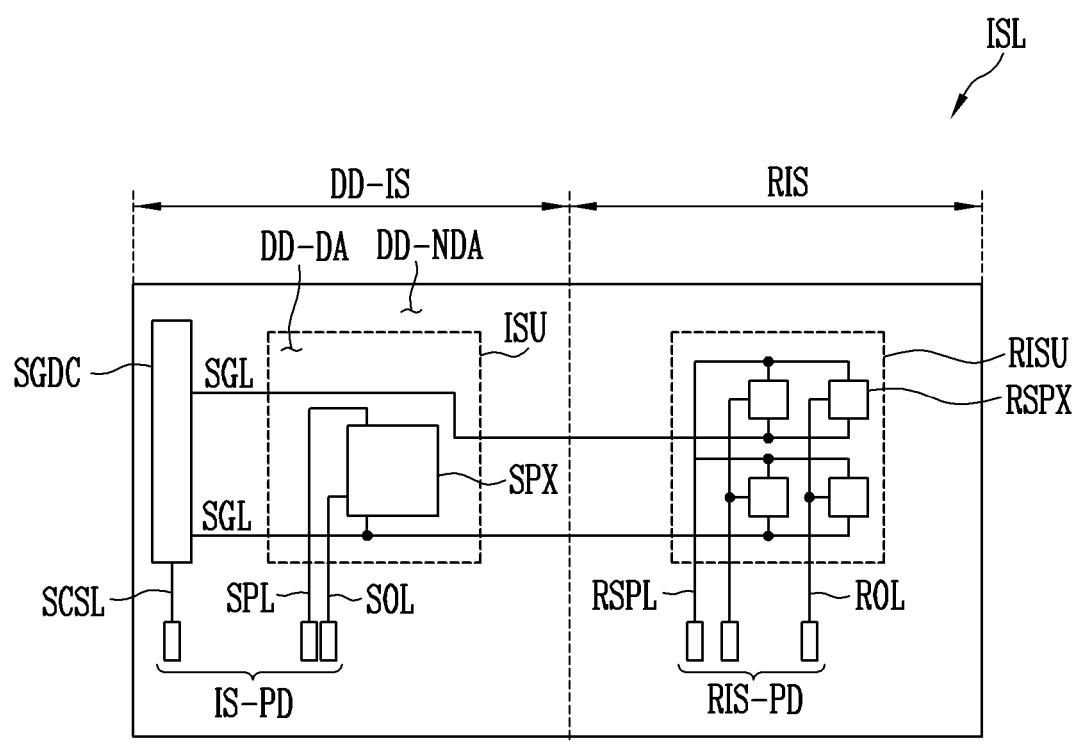
FIG. 9A is a view schematically illustrating an input sensing layer according to an embodiment of the present disclosure.

FIG. 9A is a view schematically illustrating an embodiment of the input sensing layer shown in FIG. 8.

FIG. 9A illustrates an input sensing unit ISU and an auxiliary sensing unit RISU, which are implemented using an active-self-capacitor (ASC) method.

For convenience of description, only any one of the sensing pixels SPX shown in FIG. 8 and components corresponding thereto are illustrated in FIG. 9A.

In FIG. 9A, contents overlapping with those of FIG. 8 will be omitted to avoid redundancy.

As shown in FIG. 9A, the input sensing layer ISL may include a sensing driving circuit SGDC, an input sensing unit ISU, and an auxiliary sensing unit RISU. Also, the input sensing layer ISL may include sensing pads IS-PD and auxiliary pads RIS-PD.

For convenience of description, a case where the auxiliary pads RIS-PD are disposed at an auxiliary sensing surface RIS of the input sensing layer ISL is illustrated in FIG. 9A, but the present disclosure is not limited thereto.

An embodiment in which the sensing driving circuit SGDC is disposed at one side of the input sensing unit ISU and the auxiliary sensing unit RISU is illustrated in FIG. 9A. However, the present disclosure is not limited thereto. In some embodiments, the sensing driving circuit SGDC may be disposed between the input sensing unit ISU and the auxiliary sensing unit RISU.

The sensing driving circuit SGDC may include a sensing scan driving circuit.

The sensing scan driving circuit may generate sensing scan signals and sequentially output the sensing scan signals to sensing scan lines SGL. In some embodiments, the sensing scan driving circuit may further output another control signal to a driving circuit of sensing pixels SPX or a driving circuit of auxiliary pixels RSPX.

That is, the sensing driving circuit SGDC may sequentially drive the sensing pixels SPX and the auxiliary pixels RSPX for each horizontal line.

The signal lines SGGL shown in FIG. 8 may include the sensing scan lines SGL, sensing output lines SOL, a sensing power line SPL, and a sensing control signal line SCSL. Also, the signal lines SGGL may further include auxiliary output lines ROL and an auxiliary power line RSPL.

Each of the sensing scan lines SGL may be connected to a corresponding auxiliary pixel among the auxiliary pixels RSPX while being connected to a corresponding sensing pixel among the sensing pixels SPX. That is, the corresponding sensing pixel and the corresponding auxiliary pixel may be connected to the same sensing scan line SGL.

The sensing output lines SOL and the sensing power line SPL may be connected to the sensing pixels SPX.

The sensing control signal line SCSL may be connected to the sensing driving circuit SGDS.

The auxiliary output lines ROL and the auxiliary power line RSPL may be connected to the auxiliary pixels RSPX.

In some embodiments, the sensing power line SPL and the auxiliary power line RSPL may supply the same power source. For example, the sensing power line SPL and the auxiliary power line RSPL may be electrically connected to each other.

Because the input sensing unit ISU and the auxiliary sensing unit RISU, which are shown in FIG. 9A, are implemented using the ASC method, the contents described in FIGS. 7A and 7E may be applied.

The resolution of the input sensing unit ISU may be lower than that of the auxiliary sensing unit RISU. In some embodiments, the size of the sensing pixel SPX may be larger than that of the auxiliary pixel RSPX.

Figure 9B:
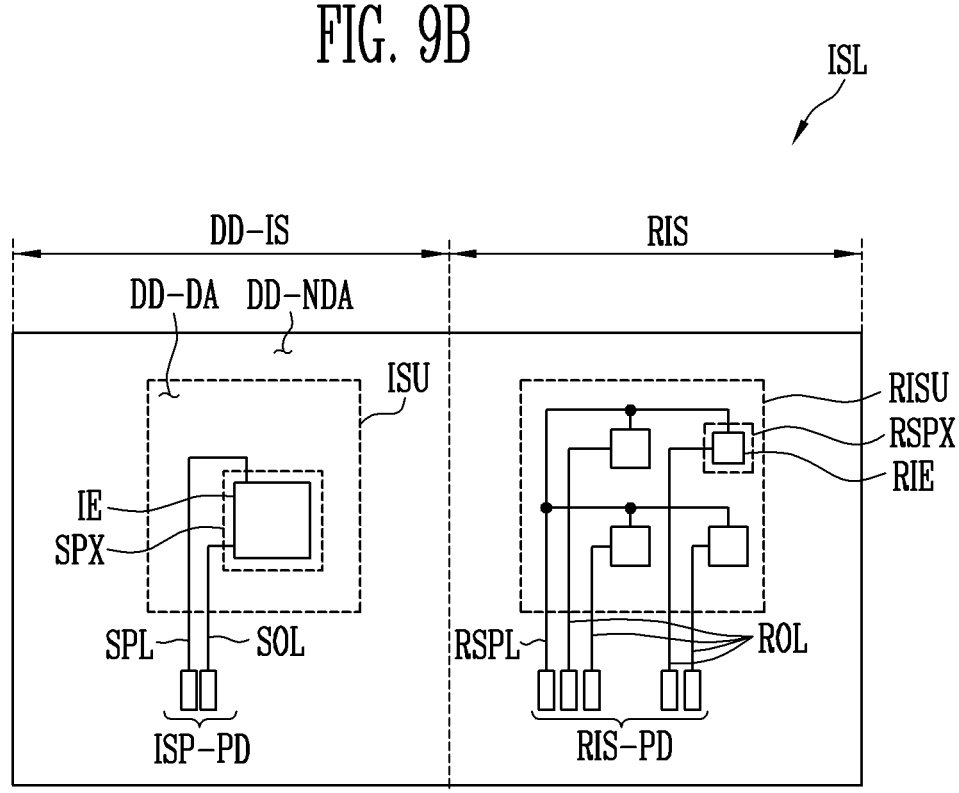
FIG. 9B is a view schematically illustrating an input sensing layer according to another embodiment of the present disclosure.

FIG. 9B is a view schematically another embodiment of the input sensing layer shown in FIG. 8 illustrates an input sensing unit ISU and an auxiliary sensing unit RISU which are implemented using a self-capacitor method.

For convenience of description, only one of the sensing pixels SPX shown in FIG. 8 and components corresponding thereto are illustrated in FIG. 9B.

In FIG. 9B, contents overlapping with those of FIG. 8 will be omitted to avoid redundancy.

As shown in FIG. 9B, the input sensing layer ISL may include an input sensing unit ISU and an auxiliary sensing unit RISU. Also, the input sensing layer ISL may include sensing pads IS-PD and auxiliary pads RIS-PD.

For convenience of description, a case where the auxiliary pads RIS-PD are disposed at an auxiliary sensing surface RIS of the input sensing layer ISL is illustrated in FIG. 9B, but the present disclosure is not limited thereto.

The signal lines SGGL shown in FIG. 8 may include sensing output lines SOL and a sensing power line SPL. Also, the signal lines SGGL may further include auxiliary output lines ROL and an auxiliary power line RSPL.

Each of the sensing output lines SOL may be connected to a corresponding sensing pixel among sensing pixels SPX.

As shown in FIG. 9B, the input sensing unit ISU may include the sensing pixels SPX. The auxiliary sensing unit RISU may include auxiliary pixels RSPX. Each of the sensing pixels SPX may include a sensing electrode IE. Each of the auxiliary pixels RSPX may include an auxiliary sensing electrode RIE.

The sensing electrodes IE and the auxiliary sensing electrodes RIE may have unique coordinate information. For example, the sensing electrodes IE and the auxiliary sensing electrodes RIE may be arranged in a matrix form. The shape and arrangement of the sensing electrodes IE and the auxiliary sensing electrodes RIE are not particularly limited. In some embodiments, the sensing electrodes IE and the auxiliary sensing electrodes RIE may have various shapes such as a mesh shape and a plate shape.

In some embodiments, the sensing electrodes IE and the auxiliary sensing electrodes RIE may be made of a metal or a transparent conductive layer. For example, the metal may include molybdenum, silver, titanium, copper, aluminum, and any alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include conductive polymer such as PEDOT, metal nano wire, graphene, etc.

The shape and material of the sensing electrodes IE and the auxiliary sensing electrodes RIE may be determined by considering sensing sensitivity. An RC delay may have influence on the sensing sensitivity. Because the sensing electrodes include metal, the sensing electrodes may have a resistance that is lower than that of the transparent conductive layer. Thus, the RC value of the sensing electrodes may be decreased and the charging time of a capacitor defined between the sensing electrodes IE or the auxiliary sensing electrodes RIE may also be decreased. The sensing electrodes IE or the auxiliary sensing electrodes RIE, which include the transparent conductive layer, are not viewed by a user, as compared with the metal, and the input area of the sensing electrodes IE or the auxiliary sensing electrodes RIE is increased, thereby increasing capacitance.

The sensing electrodes IE or the auxiliary sensing electrodes RIE, which include metal, may have a mesh shape so as to prevent the sensing electrodes IE or the auxiliary sensing electrodes RIE from being viewed by the user.

The sensing power line SPL may be connected to the sensing pixels SPX.

The auxiliary output lines ROL and the auxiliary power line RSPL may be connected to the auxiliary pixels RSPX.

In some embodiments, the sensing power line SPL and the auxiliary power line RSPL may supply the same power source. For example, the sensing power line SPL and the auxiliary power line RSPL may be electrically connected to each other.

The resolution of the input sensing unit ISU may be lower than that of the auxiliary sensing unit RISU. In some embodiments, the size of the sensing pixel SPX may be larger than that of the auxiliary pixel RSPX.

Figure 10A:
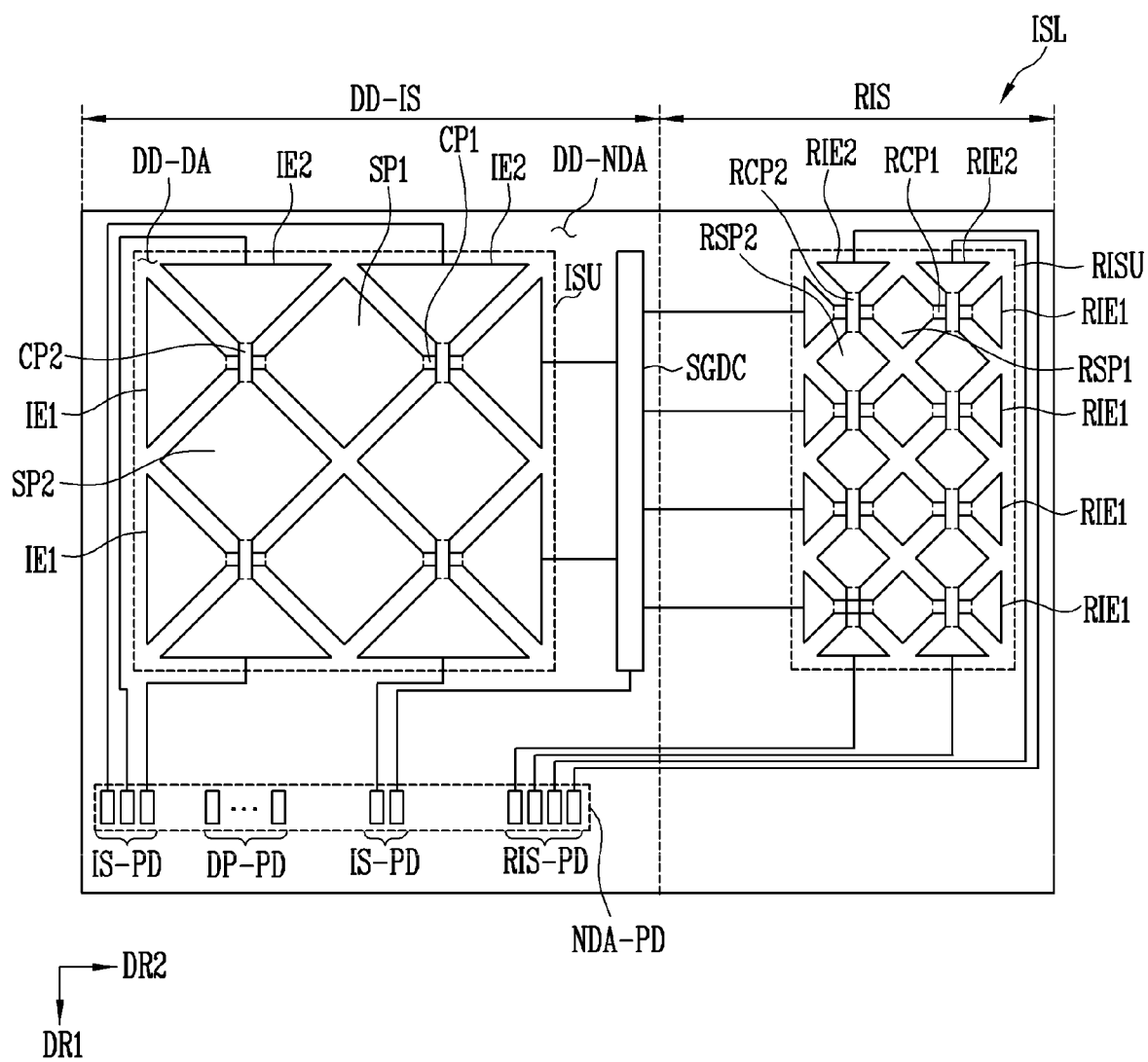
FIGS. 10A and 10B are view illustrating an input sensing layer according to still another embodiment of the present disclosure.
Figure 10B:
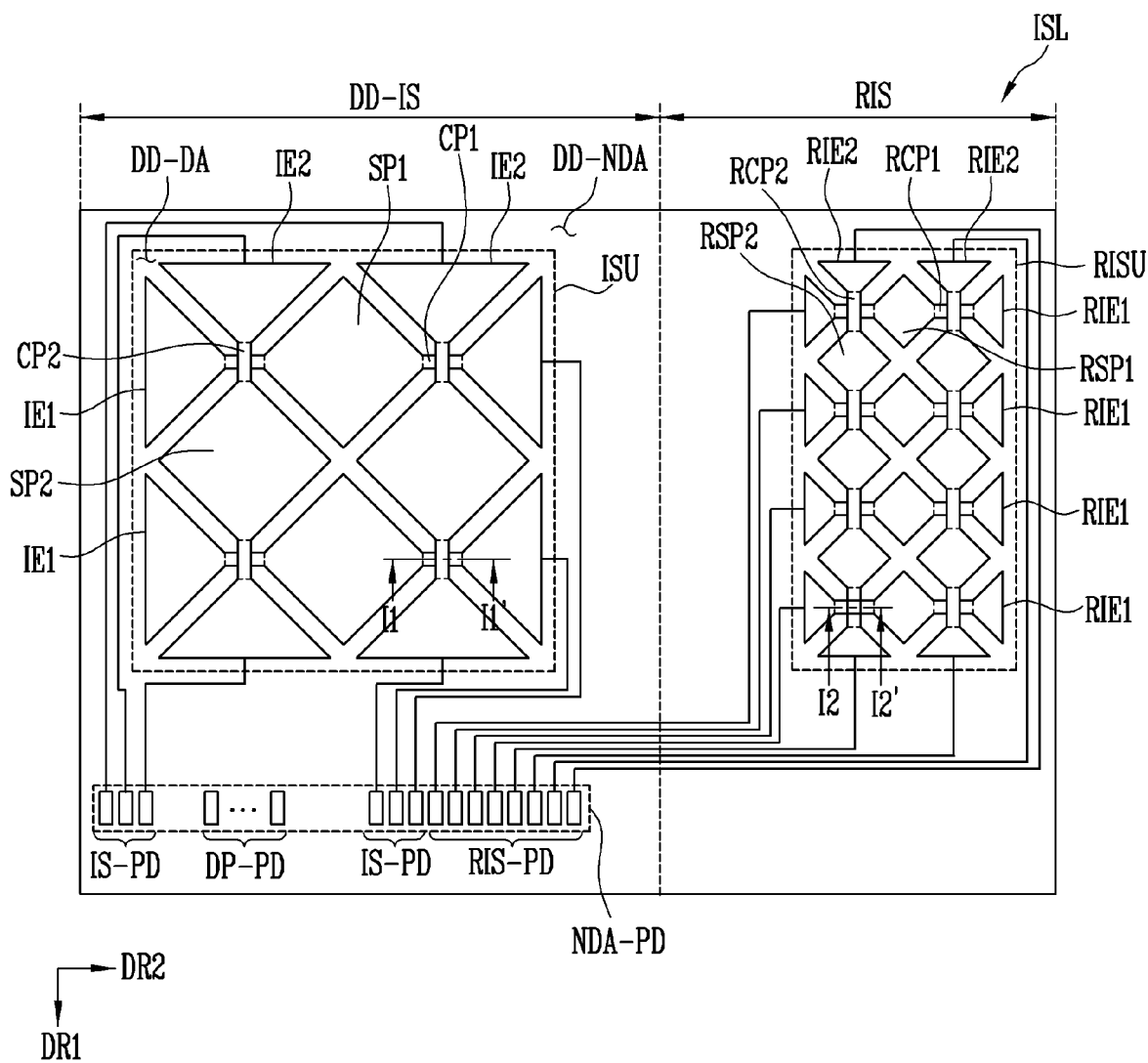

FIGS. 10A and 10B illustrate an input sensing layer ISL according to an embodiment of the present disclosure. For example, FIGS. 10A and 10B illustrate another embodiment of the input sensing layer shown in FIG. 2B.

As shown in FIGS. 10A and 10B, the input sensing layer ISL may include a display area DD-DA and a non-display area DD-NDA on a plane. In this embodiment, the non-display area DD-NDA may be defined along an edge of the display area DD-DA. The display area DD-DA and the non-display area DD-DA of the input sensing layer ISL may respectively correspond to the display area DD-DA and the non-display area DD-DA of the display device DD shown in FIGS. 1A to 1C.

FIG. 10A illustrates an input sensing unit ISU and an auxiliary sensing unit RISU, which are implemented using an active-mutual-capacitor (AMC) method.

Referring to FIG. 10A, the input sensing layer ISL may include signal lines, signal pads DP-PD, sensing pads IS-PD, auxiliary pads RIS-PD, an input sensing unit ISU, and a sensing driving circuit SGDC. Also, the input sensing layer ISL may further include an auxiliary sensing unit RISU.

As shown in FIG. 10A, the input sensing unit ISU may include first sensing electrodes 1E1 and second sensing electrodes 1E2. The auxiliary sensing unit RISU may include first auxiliary sensing electrodes RIE1 and second auxiliary sensing electrodes RIE2.

The input sensing layer ISL may be divided into a display surface DD-IS and an auxiliary sensing surface RIS. The input sensing unit ISU may be disposed at the display surface DD-IS of the input sensing layer ISL, and the auxiliary sensing unit RISU may be disposed at the auxiliary sensing surface RIS of the input sensing layer ISL.

In addition, the signal pads DP-PD, the sensing pads IS-PD, and the auxiliary pads RIS-PD may be disposed at the display surface DD-IS of the input sensing layer ISL. However, the present disclosure is not limited thereto.

The area in which the signal pads DP-PD, the sensing pads IS-PD, and the auxiliary pads RIS-PD are disposed may be defined as a pad area NDA-PD.

The sensing pads IS-PD and the auxiliary pads RIS-PD may be electrically connected to a corresponding signal line among the signal lines.

The signal pads DP-PD may overlap with a pad part of signal lines provided in the display panel shown in FIGS. 2A and 2B. The signal pads DP-PD may be floating electrodes. The signal pads DP-PD may be electrically insulated from the signal lines of the input sensing layer ISL.

An embodiment in which the sensing driving circuit SGDC is disposed between the input sensing unit ISU and the auxiliary sensing unit RISU is illustrated in FIG. 10A. However, the present disclosure is not limited thereto. In some embodiments, the sensing driving circuit SGDC may be disposed at various positions.

The sensing driving circuit SGDC may generate sensing driving signals and sequentially output the sensing driving signals to the first sensing electrodes IE1 and the first auxiliary sensing electrodes RIE1.

The first sensing electrodes IE1 and the second sensing electrodes 1E2 may intersect each other. The first auxiliary sensing electrodes RIE1 and the second auxiliary sensing electrodes RIE2 may intersect each other.

The first sensing electrodes IE1 may be arranged along a first direction DR1, and each of the first sensing electrodes IE1 may extend in a second direction DR2. The second sensing electrodes 1E2 may be arranged along the second direction DR2, and each of the second sensing electrodes 1E2 may extend in the first direction DR1.

The input sensing unit ISU and the auxiliary sensing unit RISU may sense an external input, using a mutual capacitor method and/or a self-capacitor method. After a coordinate of the external input is calculated using the mutual capacitor method during a first section, a coordinate of the external input may be re-calculated using the self-capacitor method during a second section.

Each of the first sensing electrodes IE1 may include first sensor parts SP1 and first connection parts CP1, and each of the second sensing electrodes 1E2 may include second sensor parts SP2 and second connection parts CP2.

Each of the first auxiliary sensing electrodes RIE1 may include first auxiliary sensor parts RSP1 and first auxiliary connection parts RCP1, and each of the second auxiliary sensing electrodes RIE2 may include second auxiliary sensor parts RSP2 and second auxiliary connection parts RCP2.

Two first sensor parts disposed at both ends of a first electrode among the first sensor parts SP1 may have a size smaller than, for example, ½ of that of a first sensor part disposed at the center among the first sensor parts SP1. Two second sensor parts disposed at both ends of a second electrode among the second sensor parts SP2 may have a size smaller than, for example, ½ of that of a second sensor part disposed at the center among the second sensor parts SP2.

Two first auxiliary sensor parts disposed at both ends of a first electrode among the first auxiliary sensor parts RSP1 may have a size smaller than, for example, ½ of that of a first auxiliary sensor part disposed at the center among the first auxiliary sensor parts RSP1. Two second auxiliary sensor parts disposed at both ends of a second electrode among the second auxiliary sensor parts RSP2 may have a size smaller than, for example, ½ of that of a second auxiliary sensor part disposed at the center among the second auxiliary sensor parts RSP2.

Although the sensing electrodes IE1 and 1E2 and the auxiliary sensing electrodes RIE1 and RIE2 according to the embodiment of the present disclosure are illustrated in FIG. 10A, the shape of the sensing electrodes IE1 and 1E2 and the auxiliary sensing electrodes RIE1 and RIE2 are not limited.

In an embodiment of the present disclosure, the sensing electrodes IE1 and 1E2 and the auxiliary sensing electrodes RIE1 and RIE2 may have a shape (e.g., a bar shape) in which the sensor part and the connection part are not distinguished from each other.

Although a case where the sensor parts SP1 and SP2 and the auxiliary sensor parts RSP1 and RSP2 have a rhombus shape is exemplarily illustrated, the present disclosure is not limited thereto, and the sensor parts SP1 and SP2 and the auxiliary sensor parts RSP1 and RSP2 may have another polygonal shape.

In some embodiments, the first sensor parts SP1 may be arranged along the second direction DR2, and the second sensor parts SP2 may be arranged along the first direction DR1. The first auxiliary sensor parts RSP1 may be arranged along the second direction DR2, and the second auxiliary sensor part RSP2 may be arranged along the first direction DR1.

Each of the first connection part CP1 may connect adjacent first sensor parts SP1, and each of the second connection part CP2 may connect adjacent second sensor parts SP2. Each of the first auxiliary connection parts RCP1 may connect adjacent first auxiliary sensor parts RSP1, and each of the second auxiliary connection parts RCP2 may connect adjacent second auxiliary sensor parts RSP2.

In some embodiments, the first sensing electrodes IE1 may be supplied with the same voltage as corresponding first auxiliary sensing electrode RIE1.

The resolution of the input sensing unit ISU may be lower than that of the auxiliary sensing unit RISU. In some embodiments, the size of the sensor parts SP1 and SP2 may be larger than that of the auxiliary sensor parts RSP1 and RSP2.

FIG. 10B illustrates an input sensing unit ISU and an auxiliary sensing unit RISU, which are implemented using a mutual capacitor method.

Differences between the input sensing layer ISL described in FIG. 10A and the input sensing layer ISL shown in FIG. 10B will be mainly described to avoid redundancy.

Unlike the input sensing layer ISL shown in FIG. 10*a*, the input sensing layer ISL shown in FIG. 10B may include signal lines, signal pads DP-PD, sensing pads IS-PD, auxiliary pads RIS-PD, an input sensing unit ISU, and an auxiliary sensing unit RISU.

The input sensing layer ISL according to the embodiment shown in FIG. 10B may not include the sensing driving circuit SGDC.

First sensing electrodes IE1 and first auxiliary sensing electrodes RIE1 may be directly supplied with sensing driving signals from the sensing pads IS-PD and the auxiliary pads RIS-PD.

In some embodiments, the sensing driving signals may be sequentially or simultaneously supplied to the first sensing electrodes IE1 and the first auxiliary sensing electrodes RIE1.

Figure 10C:
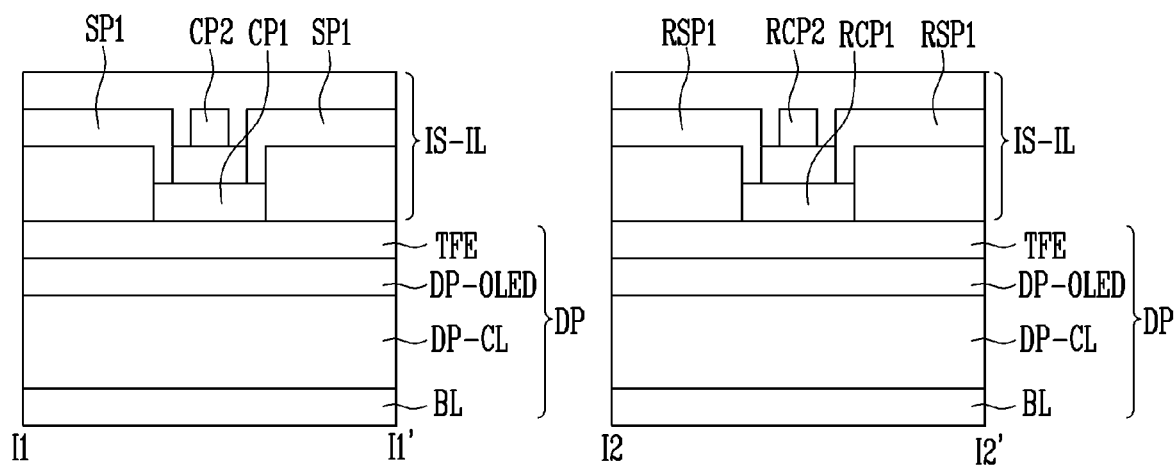
FIG. 10C is a view illustrating a section of the input sensing layer shown in FIG. 10B.

FIG. 10C is a view illustrating a section of the input sensing layer shown in FIG. 10B. That is, FIG. 10C illustrates sections taken along lines I1-I1' and I2-I2' of FIG. 10B.

In FIG. 10C, contents overlapping with those of FIG. 3 will be omitted to avoid redundancy.

Because a thin film encapsulation layer TFE shown in FIG. 10C includes at least one encapsulation inorganic layer, a more planarized base surface can be provided. Thus, although the components of the input sensing unit ISU and the auxiliary sensing unit RISU are formed by a consecutive process, a failure rate can be reduced.

As shown in FIG. 10C, the input sensing unit ISU may be formed on the thin film encapsulation layer of the display panel DP, and include first sensor parts SP1, connection parts CP1 and CP2, and at least one insulating layer IS-IL.

The auxiliary sensing unit RISU may be formed on the thin film encapsulation layer TFE of the display panel DP, and include first auxiliary sensor parts RSP1, auxiliary connection parts RCP1 and RCP2, and at least one insulating layer IS-IL.

As shown in FIG. 10C, the first sensor parts SP1 may be electrically connected to a first connection part CP1. The first connection part CP1 may include a material having a resistance lower than that of the first sensor parts SP1. The first auxiliary sensor parts RSP1 may be electrically connected to a first auxiliary connection part RCP1. The first auxiliary connection part RCP1 may include a material having a resistance lower than that of the first auxiliary sensor parts RSP1.

The first connection part CP1 intersects a second connection part CP2. The width (measured on a plane) of the first connection part CP1 may be reduced or minimized so as to reduce influence of parasitic capacitance.

The first auxiliary connection part RCP1 intersects a second auxiliary connection part RCP2. At this time, the width (measured on a plane) of the first auxiliary connection part RCP1 may be reduced or minimized so as to reduce influence of parasitic capacitance.

In some embodiments, the insulating layer IS-IL may include an inorganic layer. The inorganic layer may include at least one of aluminum oxide, titanium oxide, silicon oxide, silicon oxynitride, zirconium oxide, and hafnium oxide.

In some embodiments, the insulating layer IS-IL may include an organic layer. The organic layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

In some embodiments, the insulating layer IS-IL may be a polymer layer, for example, an acrylic polymer layer. The polymer layer can improve flexibility of the display device DD even when the input sensing unit ISU (see FIG. 10B) and the auxiliary sensing unit RISU (see FIG. 10B) are directly disposed on the display panel DP.

In order to improve flexibility, the sensor parts SP1 and SP2 and the auxiliary sensor parts RSP1 and RSP2 may have a mesh shape and include a metal. The sensor parts SP1 and SP2 and the auxiliary sensor parts RSP1 and RSP2 may be designated as metal mesh patterns.

The sensing electrodes IE1 and 1E2 and the auxiliary sensing electrodes RIE1 and RIE2 may have a mesh shape. As the sensing electrodes IE1 and 1E2 and the auxiliary sensing electrodes RIE1 and RIE2, the parasitic capacitance of the sensing electrodes IE1 and 1E2 and the auxiliary sensing electrodes RIE1 and RIE2 with electrodes of the display panel DP can be decreased.

The sensor parts SP1 and SP2, the auxiliary sensor parts RSP1 and RSP2, the second connection parts CP2, and the second auxiliary connection parts RCP2 may be formed through the same process. The sensor parts SP1 and SP2, the auxiliary sensor parts RSP1 and RSP2, the second connection parts CP2, and the second auxiliary connection parts RCP2 may include the same material and have the same stack structure.

The first connection parts CP1 and the first auxiliary connection parts RCP1 may be formed through the same process. The first connection parts CP1 and the first auxiliary connection parts RCP1 may include the same material and have the same stack structure.

Figure 11A:
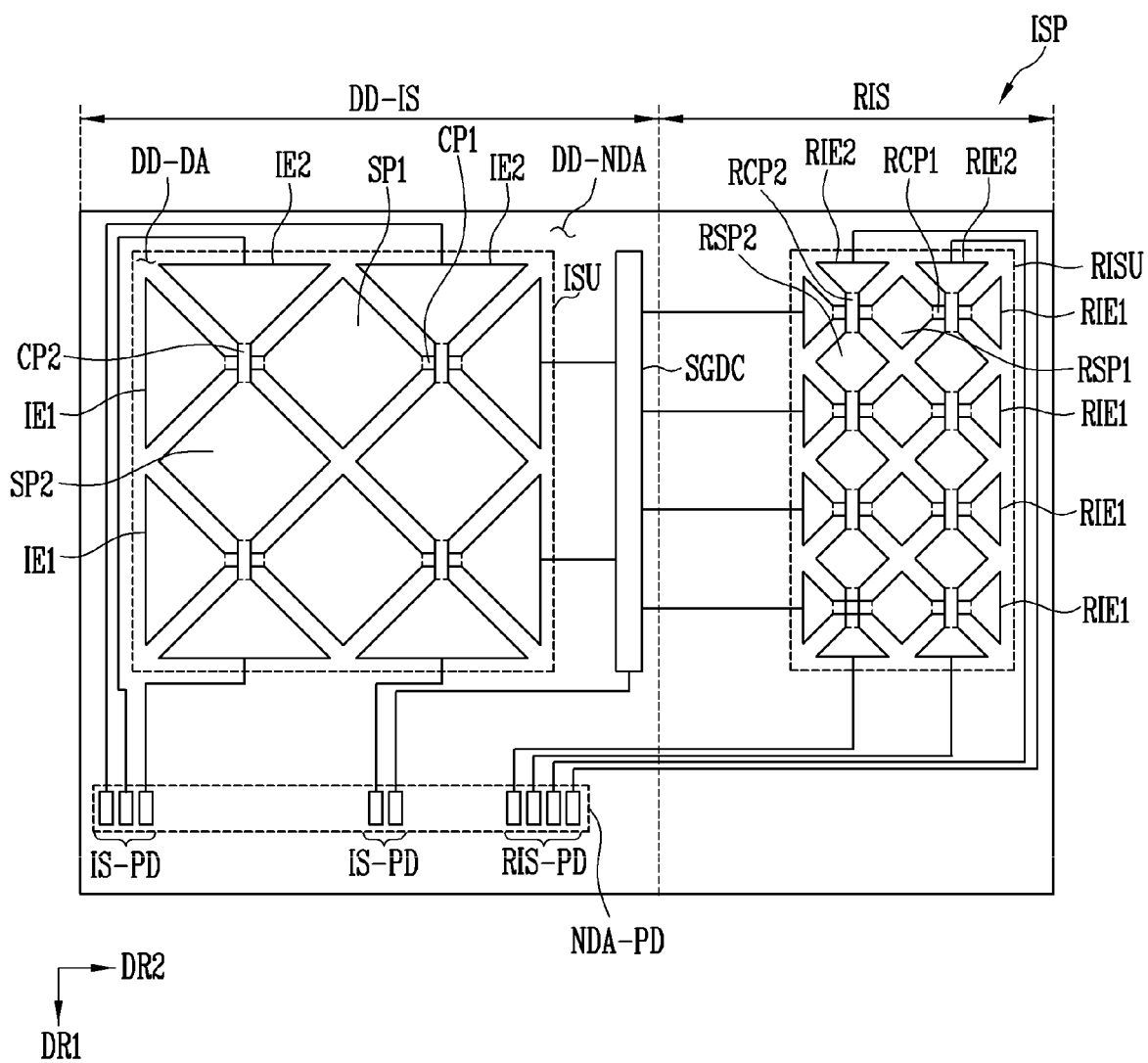
FIGS. 11A and 11B are views illustrating an input sensing panel according to an embodiment of the present disclosure.
Figure 11B:
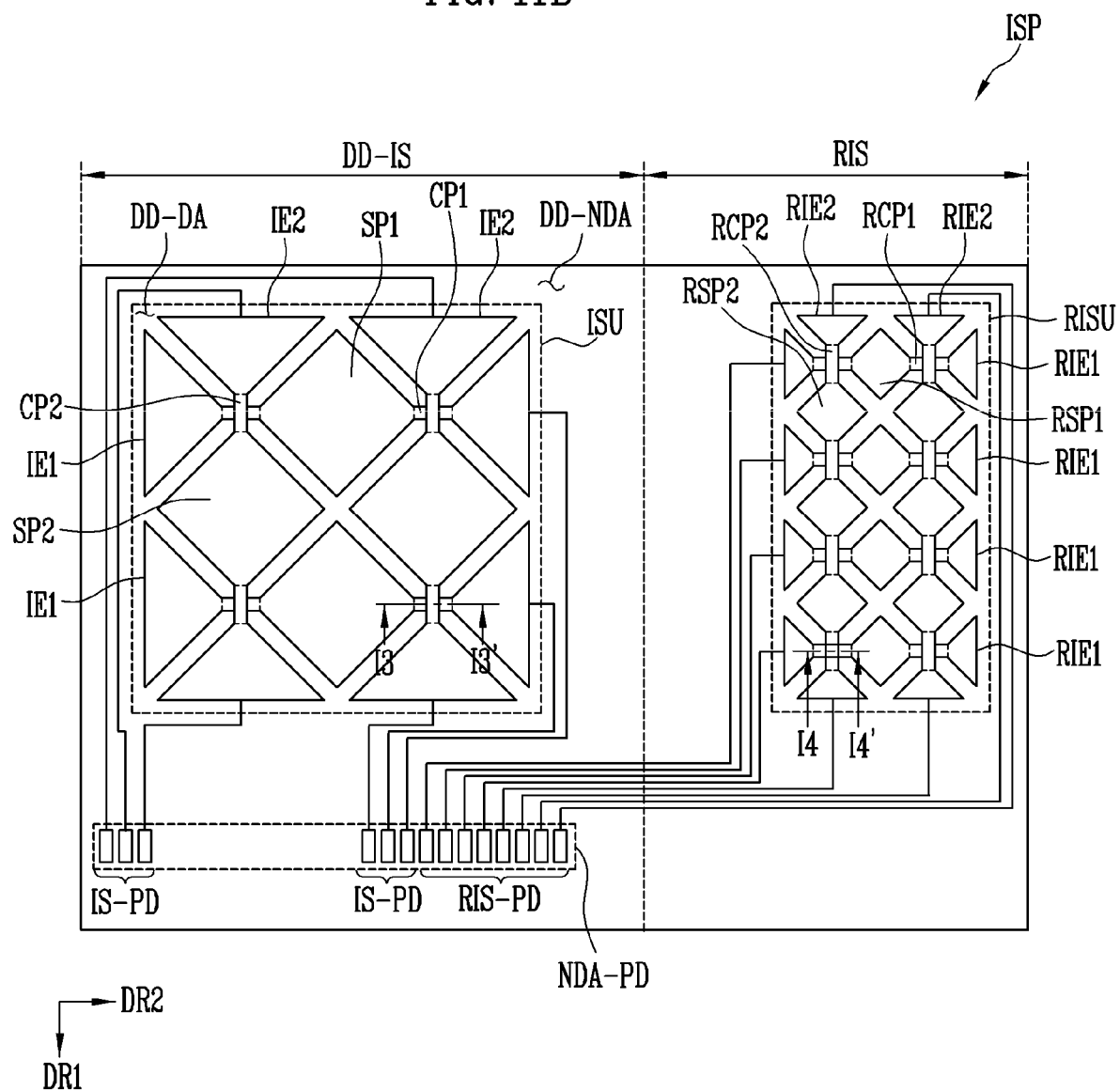

FIGS. 11A and 11B are views illustrating an input sensing panel ISP according to an embodiment of the present disclosure. For example, FIGS. 11A and 11B may illustrate the input sensing panel ISP shown in FIG. 2C.

As shown in FIGS. 11A and 11B, the input sensing panel ISP may include a display area DD-DA and a non-display area DD-NDA on a plane. In this embodiment, the non-display area DD-NDA may be defined along an edge of the display area DD-DA. The display area DD-DA and the non-display area DD-DA of the input sensing layer ISL may respectively correspond to the display area DD-DA and the non-display area DD-DA of the display device DD shown in FIGS. 1A to 1C.

FIG. 11A illustrates an input sensing unit ISU and an auxiliary sensing unit RISU, which are implemented using an active-mutual-capacitor (AMC) method.

Referring to FIG. 11A, the input sensing panel ISP may include signal lines, signal pads DP-PD, sensing pads IS-PD, auxiliary pads RIS-PD, an input sensing unit ISU, an auxiliary sensing unit RISU, and a sensing driving circuit SGDC.

As shown in FIG. 11A, the input sensing unit ISU may include first sensing electrodes 1E1 and second sensing electrodes 1E2. The auxiliary sensing unit RISU may include first auxiliary sensing electrodes RIE1 and second auxiliary sensing electrodes RIE2.

The input sensing panel ISP may be divided into a display surface DD-IS and an auxiliary sensing surface RIS. The input sensing unit ISU may be disposed at the display surface DD-IS of the input sensing panel ISP, and the auxiliary sensing unit RISU may be disposed at the auxiliary sensing surface RIS of the input sensing panel ISP.

In addition, the sensing pads IS-PD and the auxiliary pads RIS-PD may be disposed at the display surface DD-IS of the input sensing panel ISP. However, the present disclosure is not limited thereto.

The area in which the sensing pads IS-PD and the auxiliary pads RIS-PD are disposed may be defined as a pad area NDA-PD.

Each of the sensing pads IS-PD and the auxiliary pads RIS-PD may be electrically connected to a corresponding signal line.

An embodiment in which the sensing driving circuit SGDC is disposed between the input sensing unit ISU and the auxiliary sensing unit RISU is illustrated in FIG. 11A. However, the present disclosure is not limited thereto. In some embodiments, the sensing driving circuit SGDC may be disposed at various positions.

The sensing driving circuit SGDC may generate sensing driving signals and sequentially output the sensing driving signals to the first sensing electrodes IE1 and the first auxiliary sensing electrodes RIE1.

The first sensing electrodes IE1 and the second sensing electrodes 1E2 may intersect each other. The first auxiliary sensing electrodes RIE1 and the second auxiliary sensing electrodes RIE2 may intersect each other.

The first sensing electrodes IE1 may be arranged along a first direction DR1, and each of the first sensing electrodes IE1 may extend in a second direction DR2. The second sensing electrodes 1E2 may be arranged along the second direction DR2, and each of the second sensing electrodes 1E2 may extend in the first direction DR1.

The first auxiliary sensing electrodes RIE1 may be arranged along the first direction DR1, and each of the first auxiliary sensing electrodes RIE1 may extend in the second direction DR2. The second auxiliary sensing electrodes RIE2 may be arranged along the second direction DR2, and each of the second auxiliary sensing electrodes RIE2 may extend in the first direction DR1.

The input sensing unit ISU and the auxiliary sensing unit RISU may sense an external input, using a mutual capacitor method and/or a self-capacitor method. After a coordinate of the external input is calculated using the mutual capacitor method during a first section, a coordinate of the external input may be re-calculated using the self-capacitor method during a second section.

Each of the first sensing electrodes IE1 may include first sensor parts SP1 and first connection parts CP1, and each of the second sensing electrodes 1E2 may include second sensor parts SP2 and second connection parts CP2.

Each of the first auxiliary sensing electrodes RIE1 may include first auxiliary sensor parts RSP1 and first auxiliary connection parts RCP1, and each of the second auxiliary sensing electrodes RIE2 may include second auxiliary sensor parts RSP2 and second auxiliary connection parts RCP2.

Two first sensor parts disposed at both ends of a first electrode among the first sensor parts SP1 may have a size smaller than, for example, ½ of that of a first sensor part disposed at the center among the first sensor parts SP1. Two second sensor parts disposed at both ends of a second electrode among the second sensor parts SP2 may have a size smaller than, for example, ½ of that of a second sensor part disposed at the center among the second sensor parts SP2.

Two first auxiliary sensor parts disposed at both ends of a first electrode among the first auxiliary sensor parts RSP1 may have a size smaller than, for example, ½ of that of a first auxiliary sensor part disposed at the center among the first auxiliary sensor parts RSP1. Two second auxiliary sensor parts disposed at both ends of a second electrode among the second auxiliary sensor parts RSP2 may have a size smaller than, for example, ½ of that of a second auxiliary sensor part disposed at the center among the second auxiliary sensor parts RSP2.

Although the sensing electrodes IE1 and 1E2 and the auxiliary sensing electrodes RIE1 and RIE2 are illustrated according to the embodiment illustrated in FIG. 10A, the shape of the sensing electrodes IE1 and 1E2 and the auxiliary sensing electrodes RIE1 and RIE2 are not limited.

In an embodiment of the present disclosure, the sensing electrodes IE1 and 1E2 and the auxiliary sensing electrodes RIE1 and RIE2 may have a shape (e.g., a bar shape) in which the sensor part and the connection part are not distinguished from each other.

Although a case where the sensor parts SP1 and SP2 and the auxiliary sensor parts RSP1 and RSP2 have a rhombus shape is exemplarily illustrated, the present disclosure is not limited thereto, and the sensor parts SP1 and SP2 and the auxiliary sensor parts RSP1 and RSP2 may have another polygonal shape.

In some embodiments, the first sensor parts SP1 may be arranged along the second direction DR2, and the second sensor parts SP2 may be arranged along the first direction DR1. The first auxiliary sensor parts RSP1 may be arranged along the second direction DR2, and the second auxiliary sensor part RSP2 may be arranged along the first direction DR1.

Each of the first connection part CP1 may connect adjacent first sensor parts SP1, and each of the second connection part CP2 may connect adjacent second sensor parts SP2. Each of the first auxiliary connection parts RCP1 may connect adjacent first auxiliary sensor parts RSP1, and each of the second auxiliary connection parts RCP2 may connect adjacent second auxiliary sensor parts RSP2.

In some embodiments, the first sensing electrodes IE1 may be supplied with the same voltage as corresponding first auxiliary sensing electrode RIE1.

The resolution of the input sensing unit ISU may be lower than that of the auxiliary sensing unit RISU. In some embodiments, the size of the sensor parts SP1 and SP2 may be larger than that of the auxiliary sensor parts RSP1 and RSP2.

FIG. 11B illustrates an input sensing unit ISU and an auxiliary sensing unit RISU, which are implemented using a mutual capacitor method.

Differences between the input sensing panel ISP described in FIG. 11A and the input sensing panel ISP shown in FIG. 11B will be mainly described to avoid redundancy.

The input sensing panel ISP shown in FIG. 11B may include signal lines, signal pads DP-PD, sensing pads IS-PD, auxiliary pads RIS-PD, an input sensing unit ISU, and an auxiliary sensing unit RISU.

The input sensing panel ISP according to the embodiment shown in FIG. 11B may not include the sensing driving circuit SGDC.

First sensing electrodes IE1 and first auxiliary sensing electrodes RIE1 may be directly supplied with sensing driving signals from the sensing pads IS-PD and the auxiliary pads RIS-PD.

In some embodiments, the sensing driving signals may be sequentially or concurrently (e.g., simultaneously) supplied to the first sensing electrodes IE1 and the first auxiliary sensing electrodes RIE1.

FIG. 11C is a view illustrating a section of the input sensing panel shown in FIG. 11B. That is, FIG. 11C illustrates sections taken along lines I3-I3' and I4-I4' of FIG. 11B.

In FIG. 11C, contents overlapping with those of FIG. 3 will be omitted to avoid redundancy.

As shown in FIG. 11C, the input sensing unit ISU and the auxiliary sensing unit RISU may be disposed on a base surface defined on the display panel DP.

The input sensing unit ISU may be formed on the display panel DP, using an optically transparent adhesive member OCA, and include a sensing base layer IBL, first sensor parts SP1, connection parts CP1, CP2, and at least one insulating layer IS-IL.

The auxiliary sensing unit RISU may be formed on the display panel DP, using an optically transparent adhesive member, and include a sensing base layer IBL, first auxiliary sensor parts RSP1, auxiliary connection parts RCP1 and RCP2, and at least one insulating layer IS-IL.

The sensing base layer IBL may include a synthetic resin film. The sensing base layer IBL may include a glass substrate, a metal substrate, an organic/inorganic composite material substrate, etc.

As shown in FIG. 11C, the first sensor parts SP1 may be electrically connected to a first connection part CP1. The first connection part CP1 may include a material having a resistance lower than that of the first sensor parts SP1. For example, the first connection part CP1 may include a metal.

The first auxiliary sensor parts RSP1 may be electrically connected to a first auxiliary connection part RCP1. The first auxiliary connection part RCP1 may be formed of the same material as the first auxiliary sensor parts RSP1. For example, the first auxiliary connection part RCP1 and the first auxiliary sensor parts RSP1 may include a metal.

In some embodiments, the insulating layer IS-IL may include an inorganic layer. The inorganic layer may include at least one of aluminum oxide, titanium oxide, silicon oxide, silicon oxynitride, zirconium oxide, and hafnium oxide.

In some embodiments, the insulating layer IS-IL may include an organic layer. The organic layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

In some embodiments, the insulating layer IS-IL may be a polymer layer, for example, an acrylic polymer layer. The polymer layer can improve flexibility of the display device DD even when the input sensing unit ISU (see FIG. 11B) and the auxiliary sensing unit RISU (see FIG. 11B) are directly disposed on the display panel DP.

The first connection parts CP1 may have a mesh shape and include a metal. The first connection parts CP1 may be designated as metal mesh patterns.

In addition, the auxiliary sensor parts RSP1 and RSP2 and the first auxiliary connection parts RCP1 may have a mesh shape and include a metal. The auxiliary sensor parts RSP1 and RSP2 and the first auxiliary connection parts RCP1 may be designated as metal mesh pattern.

The first connection parts CP1, the auxiliary sensor parts RSP1 and RSP2, and the first auxiliary connection parts RCP may be formed through the same process. The first connection parts CP1, the auxiliary sensor parts RSP1 and RSP2, and the first auxiliary connection parts RCP may include the same material and have the same stack structure.

The sensor parts SP1 and SP2 and the second connection parts CP2 may include a transparent conductive material. In addition, the second auxiliary connection parts RCP2 may include a transparent conductive material.

The second auxiliary connection parts RCP2, the sensor parts SP1 and SP2, and the second connection parts CP2 may be formed through the same process. The second auxiliary connection parts RCP2, the sensor parts SP1 and SP2, and the second connection parts CP2 may include the same material and have the same stack structure.

The display device according to the present disclosure can implement enhanced security, using the auxiliary sensing unit capable of sensing a fingerprint.

Further, the display device according to the present disclosure enables a user to release locking while gripping the display device.

Further, the display device according to the present disclosure can implement a button, using the auxiliary sensing unit capable of sensing an input.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device having a display surface located at a front surface and an auxiliary sensing surface located at a side surface, the display device comprising:
 a display panel comprising a display area and a non-display area;
 an input sensing unit on the display panel; and
 an auxiliary sensing unit at the auxiliary sensing surface, the auxiliary sensing unit being configured to sense at least one of a fingerprint or a palm print of a user,
 wherein the auxiliary sensing unit is formed in the same layer as the display panel, and wherein the display panel further comprises a display unit comprising display pixels at the display surface and the auxiliary sensing unit comprising auxiliary pixels at the auxiliary sensing surface;

wherein the display panel further comprises:

a base layer;

a circuit element layer on the base layer;

a display element layer on the circuit element layer;

an auxiliary sensing element layer on the circuit element layer and spaced apart from the display element layer; and a thin film encapsulation layer that encapsulates the display element layer and the auxiliary sensing element layer.

2. The display device of claim 1, wherein the display element layer comprises light emitting devices of the display pixels, and wherein the auxiliary sensing element layer comprises auxiliary sensing electrodes of the auxiliary pixels.

3. The display device of claim 2, wherein the circuit element layer comprises transistors from the display pixels and the auxiliary pixels.

4. The display device of claim 3, wherein the display element layer is located in the display area.

5. A display device having a display surface located at a front surface and an auxiliary sensing surface located at a side surface, the display device comprising:

a display panel comprising a display area and a non-display area;

an input sensing unit on the display panel; and an auxiliary sensing unit at the auxiliary sensing surface, the auxiliary sensing unit being configured to sense at least one of a fingerprint or a palm print of a user, wherein the auxiliary sensing unit is formed in the same layer as the display panel, wherein the display panel further comprises a display unit comprising display pixels at the display surface and the auxiliary sensing unit comprising auxiliary pixels at the auxiliary sensing surface, wherein the display panel further comprises a driving circuit configured to drive the display pixels and the auxiliary pixels, and wherein the driving circuit sequentially drives the display pixels and the auxiliary pixels for each horizontal line.

6. The display device of claim 5, wherein the driving circuit sequentially outputs scan signals to scan lines, and the display pixels and the auxiliary pixels are respectively connected to the same scan lines for each horizontal line.

7. The display device of claim 6, wherein the driving circuit is between the display unit and the auxiliary sensing unit.

8. A display device having a display surface located at a front surface and an auxiliary sensing surface located at a side surface, the display device comprising:

a display panel comprising a display area and a non-display area;

an input sensing unit on the display panel; and an auxiliary sensing unit at the auxiliary sensing surface, the auxiliary sensing unit being configured to sense at least one of a fingerprint or a palm print of a user, wherein the auxiliary sensing unit is formed in the same layer as any one of the display panel and the input sensing unit, the same layer having a first portion parallel to the front surface and a second portion parallel to the side surface, the first portion comprising any one of the display panel and the input sensing unit and the second portion comprising the auxiliary sensing unit, wherein the display panel further comprises a display unit comprising display pixels at the display surface and the auxiliary sensing unit comprising auxiliary pixels at the auxiliary sensing surface, wherein the auxiliary sensing unit is formed in the same layer as the display panel, wherein an auxiliary pixel connected to an ith (i is an integer of 2 or more) scan line and an auxiliary output line among the auxiliary pixel comprises:

an auxiliary sensing electrode;

a first transistor having a gate electrode connected to the auxiliary sensing electrode, the first transistor controlling a current output through the auxiliary output line;

a second transistor having a gate electrode connected to the ith scan line, the second transistor being connected between an auxiliary power line and the first transistor;

a third transistor having a gate electrode connected to an (i-1)th scan line, the third transistor being connected between the auxiliary power line and the auxiliary sensing electrode; and a capacitor electrode forming a first capacitor with the auxiliary sensing electrode, the capacitor electrode being connected to the ith scan line.

9. The display device of claim 8, wherein the auxiliary sensing electrode forms a second capacitor with a finger of a user when a touch occurs.

10. The display device of claim 9, wherein the auxiliary sensing unit recognizes the fingerprint or the palm print of the user, according to a change in capacitance of the second capacitor, corresponding to the touch.

* * * * *